United States Patent
Zhang et al.

(10) Patent No.: US 9,472,531 B2
(45) Date of Patent: Oct. 18, 2016

(54) DEVICE PACKAGING FACILITY AND METHOD, AND DEVICE PROCESSING APPARATUS UTILIZING PHTHALATE

(71) Applicant: SEMIgear, Inc., Wakefield, MA (US)

(72) Inventors: Jian Zhang, Brookline, MA (US); Joshua Pinnolis, Newton, MA (US); Shijian Luo, South Hamilton, MA (US)

(73) Assignee: Semigear, Inc., Wakefield, MA (US)

( * ) Notice: Subject to any disclaimer, the term of this patent is extended or adjusted under 35 U.S.C. 154(b) by 0 days.

(21) Appl. No.: 14/616,029

(22) Filed: Feb. 6, 2015

(65) Prior Publication Data
US 2016/0233191 A1   Aug. 11, 2016

(51) Int. Cl.
*G01R 31/26* (2014.01)
*H01L 23/00* (2006.01)
*H01L 21/66* (2006.01)

(52) U.S. Cl.
CPC .............. *H01L 24/92* (2013.01); *H01L 22/12* (2013.01); *H01L 24/81* (2013.01); *H01L 24/83* (2013.01); *H01L 2224/832* (2013.01); *H01L 2224/8385* (2013.01); *H01L 2224/83191* (2013.01); *H01L 2224/83192* (2013.01); *H01L 2224/83948* (2013.01); *H01L 2224/92143* (2013.01); *H01L 2924/06* (2013.01); *H01L 2924/20105* (2013.01); *H01L 2924/20106* (2013.01)

(58) Field of Classification Search
USPC ........................................................ 438/15
See application file for complete search history.

(56) References Cited

U.S. PATENT DOCUMENTS 5,120,665 A * 6/1992 Tsukagoshi ........... H01L 21/563
                                                      156/64
2013/0199577 A1   8/2013 Chen et al.

FOREIGN PATENT DOCUMENTS

| CN | 1498520 A | 5/2004 |
|---|---|---|
| CN | 101103449 A | 1/2008 |
| CN | 102029488 A | 4/2011 |
| JP | H08-340174 A | 12/1996 |
| JP | 11-114667 | 4/1999 |
| JP | 2000-031183 A | 1/2000 |
| JP | 2001311005 | * 11/2001 |
| JP | 2004-172251 A | 6/2004 |
| JP | 2009-542019 A | 11/2009 |
| JP | 2012-033518 A | 2/2012 |
| KR | 10-2009-0099008 | 9/2009 |

* cited by examiner

*Primary Examiner* — Timor Karimy
(74) *Attorney, Agent, or Firm* — Harness, Dickey & Pierce, P.L.C.

(57) ABSTRACT

Provided are a device packing facility and method using phthalate and a device processing apparatus utilizing the phthalate. The device packaging facility includes a mounting unit providing phthalate between first and second devices to attach the first and second devices to each other, a processing unit thermally processing the first and second devices that are attached to each other to remove the phthalate and fix the first and second devices to each other, and a transfer unit transferring the first and second devices that are attached to each other from the mounting unit to the processing unit.

15 Claims, 26 Drawing Sheets

DEVICE PACKAGING FACILITY AND METHOD, AND DEVICE PROCESSING APPARATUS UTILIZING PHTHALATE

BACKGROUND OF THE INVENTION

The present invention disclosed herein relates to a device packing facility and method using phthalate and a device processing apparatus utilizing the phthalate.

When a device such as a semiconductor chip is manufactured, a packaging process for mounting the device on the other device such as a substrate is performed. Particularly, a 3D packaging technology for a 3D IC by mounting one chip on the other chip facilitates more high-density packing. Thus, shorter chip-to-chip connection a high degree of freedom in line layout may be realized to manufacture a high-performance IC.

In general, flux is used in a semiconductor packaging process while one device is mounted on the other device. The flux may be applied to a contact portion between the devices to adhere to each other.

However, the flux is harmful to the human body. In addition, if the flux remains on the device, the flux may interrupt a normal operation of the device to deteriorate performance of the device. Thus, in the typical semiconductor packaging process using the flux, it is necessary to perform processes of cleaning and drying the devices so as to remove the flux remaining on the devices after the devices are attached and bonded to each other.

SUMMARY OF THE INVENTION

The present invention provides a device packaging facility and method, which are capable of reducing the effects on the human body, equipment, and environments by using phthalate instead of flux, and a device processing apparatus utilizing the phthalate.

The present invention also provides a device packaging facility and method, which are capable of excluding cleaning and drying processes that are essentially involved before inspection is performed after devices are bonded to each other when flux is used for packaging, and a device processing apparatus utilizing the phthalate.

Embodiments of the present invention provide device packaging facilities including: a mounting unit providing phthalate between first and second devices to attach the first and second devices to each other; a processing unit thermally processing the first and second devices that are attached to each other to remove the phthalate and fix the first and second devices to each other; and a transfer unit transferring the first and second devices that are attached to each other from the mounting unit to the processing unit.

In some embodiments, the first device may include at least one of a solder ball, a semiconductor chip, and a substrate, and the second device may include at least one of the semiconductor and the substrate.

In other embodiments, the phthalate may include at least one of dimethyl phthalate (DMP) and diisobutyl phthalate (DIBP).

In still other embodiments, the mounting unit may immerse a protruding portion of the first device in the phthalate to apply the phthalate to the protruding portion and move at least one of the first and second devices to allow the protruding portion to contact the second device.

In even other embodiments, the mounting unit may apply the phthalate to at least one of the first and second devices and move at least one of the first and second devices to allow the first and second devices to contact each other on the portion coated with the phthalate.

In yet other embodiments, the mounting unit may apply or dispense a film or droplet formed of the phthalate to at least one of the first and second devices and move at least one of the first and second devices to allow the first and second devices to contact each other on the portion coated with the phthalate.

In further embodiments, the mounting unit may contact the first and second devices with each other and provide the phthalate to an edge of a contact portion between the first and second devices to allow the phthalate to be absorbed, stuck or wicked onto a boundary between the first and second devices.

In still further embodiments, the processing unit may preheat the first and second devices that are attached to each other at a first temperature to remove the phthalate, heat the first and second devices at a second temperature that is greater than the first temperature to melt a bonding material disposed on a contact portion between the first and second devices, and cool the first and second devices at a third temperature that is less than the second temperature to solidify the bonding material.

In even further embodiments, the first temperature may be lower than a boiling point of the phthalate, the second temperature may be greater than or equal to a melting point of the bonding material, and the third temperature may be less than the melting point of the bonding material.

In yet further embodiments, the processing unit may preheat the first and second devices that are attached to each other at a temperature of about 180° C. to about 220° C. to remove the phthalate.

In much further embodiments, the processing unit may preheat the first and second devices that are attached to each other at the temperature of about 180° C. to about 220° C. for about 60 seconds or more to remove the phthalate.

In still much further embodiments, the processing unit may preheat the first and second devices that are attached to each other under an atmospheric pressure or a pressure that is less than the atmospheric pressure to remove the phthalate.

In even much further embodiments, the processing unit may preheat the first and second devices that are attached to each other at the first temperature while exposing the first and second devices to nitrogen or nitrogen containing formic acid vapor to remove the phthalate.

In yet much further embodiments, after removing the phthalate, the processing unit may heat the first and second devices at a fourth temperature that is greater than the first temperature under an atmospheric pressure or a pressure that is less than the atmospheric pressure while exposing the first and second devices to formic acid vapor to remove impurities formed on a surface of the bonding material.

In much still further embodiments, the first and second devices that are fixed to each other may be taken out of the device packaging facility and transferred to an inspection facility.

In other embodiments of the present invention, device packaging methods include: providing phthalate between first and second devices to attach the first and second devices to each other; thermally processing the first and second devices that are attached to each other to remove the phthalate; and thermally processing the first and second devices to fix the first and second devices to each other.

In some embodiments, the first device may include at least one of a solder ball, a semiconductor chip, and a substrate, and the second device may include at least one of the semiconductor and the substrate.

In other embodiments, the phthalate may include at least one of dimethyl phthalate (DMP) and diisobutyl phthalate (DIBP).

In still other embodiments, the attaching of the first and second devices may include: immersing a protruding portion of the first device in the phthalate to apply the phthalate to the protruding portion; and moving at least one of the first and second devices to allow the protruding portion to contact the second device.

In even other embodiments, the attaching of the first and second devices may include: applying the phthalate to at least one of the first and second devices; and moving at least one of the first and second devices to allow the first and second devices to contact each other on the portion coated with the phthalate.

In yet other embodiments, the attaching of the first and second devices may include: providing a film formed of the phthalate to at least one of the first and second devices; and moving at least one of the first and second devices to allow the first and second devices to contact each other on the portion coated with the phthalate.

In further embodiments, the attaching of the first and second devices may include: contacting the first and second devices with each other; and providing the phthalate to an edge of a contact portion between the first and second devices to allow the phthalate to be absorbed onto a boundary between the first and second devices.

In still further embodiments, the moving of the phthalate may include preheating the first and second devices that are attached to each other at a first temperature to remove the phthalate, and the fixing of the first and second devices may include: heating the first and second devices at a second temperature that is greater than the first temperature to melt a bonding material disposed on a contact portion between the first and second devices; and cooling the first and second devices at a third temperature that is less than the second temperature to solidify the bonding material.

In even further embodiments, the first temperature may be lower than a boiling point of the phthalate, the second temperature may be greater than or equal to a melting point of the bonding material, and the third temperature may be less than the melting point of the bonding material.

In yet further embodiments, the removing of the phthalate may include preheating the first and second devices that are attached to each other at a temperature of about 180° C. to about 220° C.

In much further embodiments, the preheating of the first and second devices may include preheating the first and second devices that are attached to each other at the temperature of about 180° C. to about 220° C. for about 60 seconds.

In still much further embodiments, the removing of the phthalate may include preheating the first and second devices that are attached to each other under an atmospheric pressure or a pressure that is less than the atmospheric pressure.

In still much further embodiments, the removing of the phthalate may include preheating the first and second devices that are attached to each other at the first temperature while exposing the first and second devices to nitrogen or nitrogen containing formic acid vapor.

In even much further embodiments, the device packaging methods may further include, after the removing of the phthalate, heating the first and second devices at a fourth temperature that is greater than the first temperature under an atmospheric pressure or a pressure that is less than the atmospheric pressure while exposing the first and second devices to formic acid vapor to remove impurities formed on a surface of the bonding material.

In yet much further embodiments, the first and second devices that are fixed to each other may be taken out of the device packaging facility and be inspected by an inspection facility.

In still other embodiments of the present invention, device processing apparatuses include: a process chamber, a device support and a heater. The first and second devices are attached to each other using the phthalate and then thermally processed within the process chamber to remove the phthalate and permanently affix the first device to the second device. The device support is disposed within the process chamber to support the first and second devices that are attached to each other. The heater heats the first and second devices that are attached to each other.

In some embodiments, the first device may include at least one of a solder ball, a semiconductor chip, and a substrate, and the second device may include at least one of the semiconductor and the substrate.

In other embodiments, the phthalate may include at least one of dimethyl phthalate (DMP) and diisobutyl phthalate (DIBP).

In still other embodiments, the heater may preheat the first and second devices that are attached to each other at a first temperature to remove the phthalate, heat the first and second devices at a second temperature that is greater than the first temperature to melt a bonding material disposed on a contact portion between the first and second devices, and cool the first and second devices at a third temperature that is less than the second temperature to solidify the bonding material.

In even other embodiments, the first temperature may be lower than a boiling point of the phthalate, the second temperature may be greater than or equal to a melting point of the bonding material, and the third temperature may be less than the melting point of the bonding material.

In yet other embodiments, the heater may preheat the first and second devices that are attached to each other at a temperature of about 180° C. to about 220° C. to remove the phthalate.

In further embodiments, the heater may preheat the first and second devices that are attached to each other at the temperature of about 180° C. to about 220° C. for about 60 seconds or more to remove the phthalate.

In still further embodiments, the device processing apparatuses may further include a pressure control part for maintaining an inner pressure of the process chamber to an atmospheric pressure or a pressure that is less than the atmospheric pressure when the preheating is performed.

In even further embodiments, the device processing apparatuses may further include a supply (e.g., bubbler or delivery) part for supplying nitrogen or nitrogen containing formic acid vapor into the process chamber when the preheating is performed.

In yet further embodiments, the fluid supply part may supply the formic acid vapor into the process chamber after the preheating, and the heater may heat the first and second devices at a fourth temperature that is greater than the first temperature to remove impurities formed on a surface of the bonding material.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

In the following description, the technical terms are used only for explaining a specific exemplary embodiment while not limiting the present invention. The terms of a singular form may include plural forms unless specifically mentioned. The meaning of 'comprises' and/or 'comprising' specifies a composition, a component, a constituent, a stop, an operation and/or an element does not exclude other compositions, components, constituents, steps, operations and/or elements. In the specification, 'and/or' means that it includes at least one of listed components.

In semiconductor packaging according to the embodiments of the present invention, phthalate instead of typical flux that has been used for bonding devices to each other is used to perform the packaging. The phthalate may be a chemical additive that is used as a plasticizer when plastic molding is performed, particularly, may be a material that is used for softening polyvinyl chloride (PVC). In the embodiments of the present invention, the phthalate, particularly, dimethyl phthalate (DMP) or diisobutyl phthalate (DIBP) may be utilized in the semiconductor packaging to solve various limitations that occur by using the typical flux and simplify a production process, thereby reducing manufacturing costs.

Hereinafter, exemplary embodiments of the present invention will be described in detail with reference to the accompanying drawings.

Figure 1:
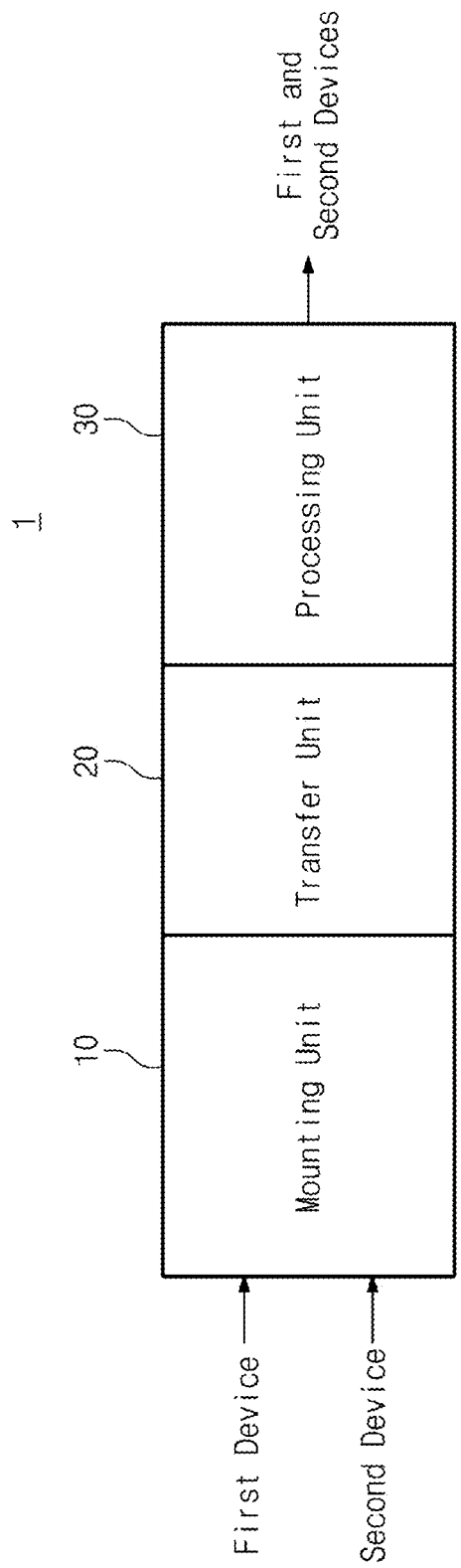
FIG. 1 is a schematic view of a device packaging facility according to an embodiment of the present invention.

FIG. 1 is a schematic view of a device packaging facility 1 according to an embodiment of the present invention.

Referring to FIG. 1, the device packaging facility 1 may be a facility in which at least two devices are bonded to each other to perform semiconductor packaging. The device packaging facility 1 may include a mounting unit 10, a processing unit 20, and a transfer unit 30.

The mounting unit 10 may provide phthalate between first and second devices to bond the first and second devices to each other. The processing unit 20 may thermally process the first and second devices that are bonded to each other to remove the phthalate and fix the first and second device to each other. The transfer unit 30 may transfer the first and second devices that are bonded to each other from the mounting unit 10 to the processing unit 20.

The first device may be a mounted object that is mounted on the second device and bonded to the second device. For example, the first device may include at least one of a solder ball, a semiconductor chip, a substrate, but is not limited thereto. Also, the second device may be a mounting object on which the first device is mounted. For example, the second device may include at least one of a semiconductor chip and a substrate, but is not limited thereto. That is to say, the first and second devices may be any objects that are bonded and fixed to each other in the semiconductor packaging.

According to the embodiment of the present invention, the phthalate used in the device packaging may include at least one of DMP and DIBP.

The mounting unit 10 may provide the phthalate between the first and second devices to perform a device mounting process of bonding the first and second devices to each other.

According to the embodiment of the prevent invention, the mounting unit 10 may immerse a protruding portion of the first device in the phthalate to apply the phthalate to the protruding portion, and move at least one of the first and second devices to allow the protruding portion to contact the second device.

Figure 2:
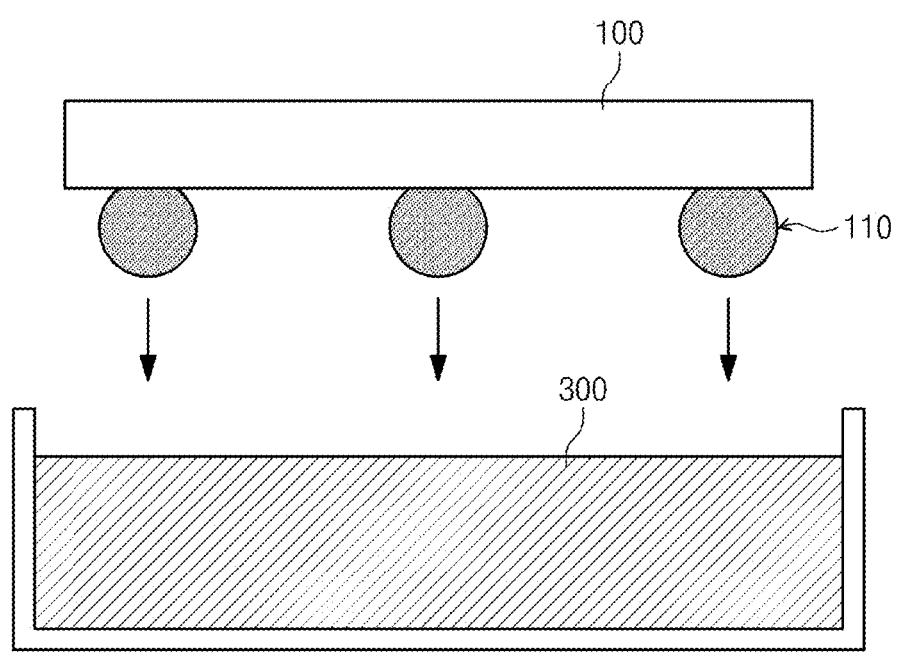
FIGS. 2 to 4 are views for explaining a process of mounting a device according to an embodiment of the present invention.
Figure 3:
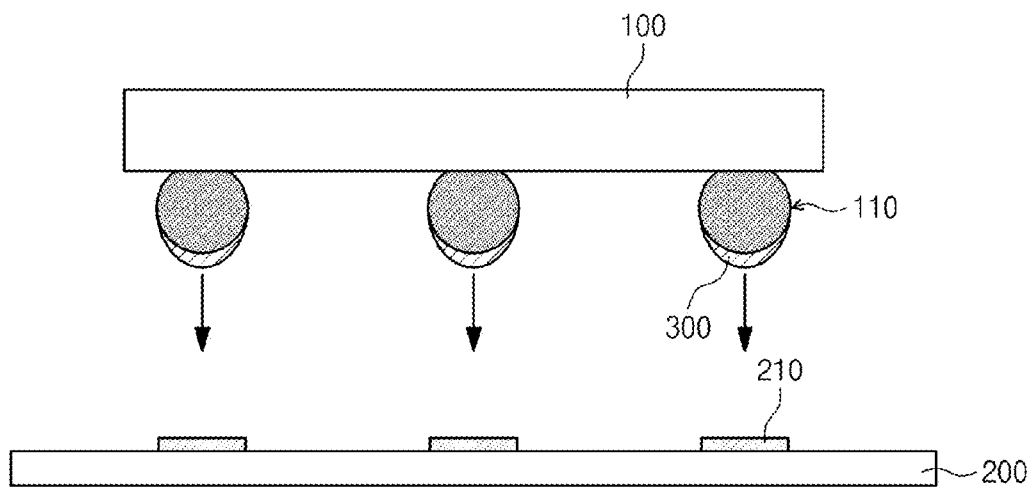
Figure 4:
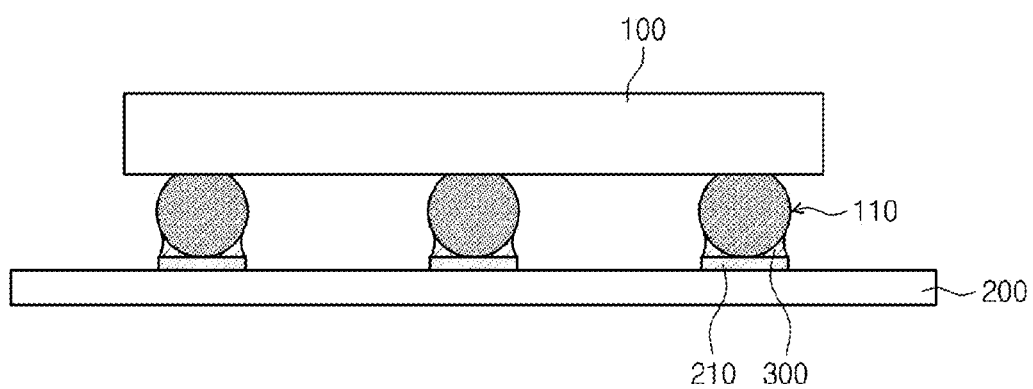

FIGS. 2 to 4 are views for explaining a process of mounting a device according to an embodiment of the present invention.

Referring to FIG. 2, the mounting unit 10 may immerse a protruding portion 110 of the first device 100 in phthalate 300 to apply the phthalate 300 to the protruding portion 110. To apply the phthalate 300 to the protruding portion 110 of the first device 100 as described above, the mounting unit 10 may include an elevation device for lifting the first device 100.

Then, referring to FIGS. 3 and 4, the mounting unit 10 may move at least one of the first and second devices 100 and 200 to allow the protruding portion 110 coated with the phthalate 300 to contact a pad 210 disposed on the second device 200.

Although the mounting unit 10 moves the first device 100 toward the second device 200 to allow the protruding portion 110 to contact the pad 210 of the second device 200 in the embodiment illustrated in FIG. 3, the present invention is not limited thereto. For example, the mounting unit 100 may move the second device 200 toward the first device 100 to allow the protruding portion 110 to contact the pad 210. Alternatively, the mounting unit 100 may move both of the first and second devices 100 and 200 to allow the protruding portion 110 to contact the pad 210. In this case, the mounting unit 10 may include an elevation device for lifting the second device 200.

According to another embodiment of the present invention, a mounting unit 10 may apply phthalate 300 to at least one of first and second devices 100 and 200 to move at least one of the first and second devices 100 and 200 so that the first and second devices 100 and 200 contact each other on the phthalate 300.

Figure 5:
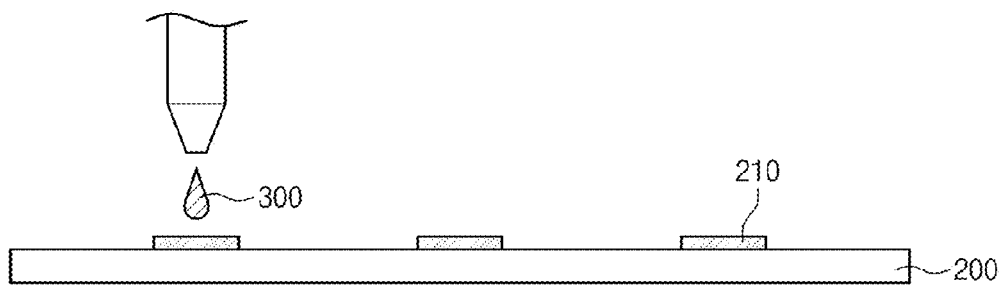
FIGS. 5 to 7 are views for explaining a process of mounting a device according to another embodiment of the present invention.
Figure 6:
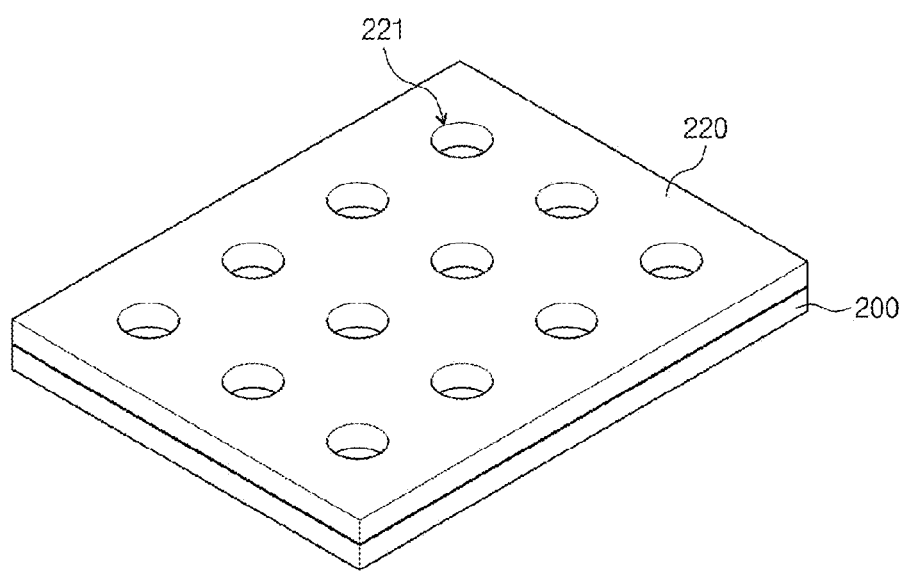
Figure 7:
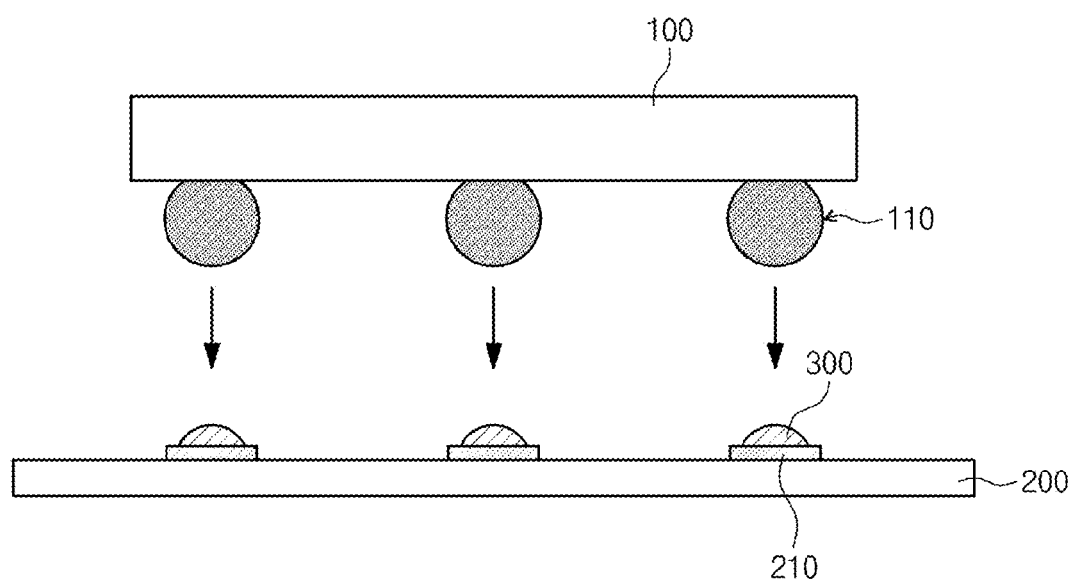

FIGS. 5 to 7 are views for explaining a process of mounting a device according to another embodiment of the present invention.

Referring to FIG. 5, a mounting unit 100 may apply phthalate 300 to at least one of first and second devices 100 and 200. Although the mounting unit 10 applies the phthalate 300 to a pad 210 of the second device 200 in the embodiment illustrated in FIG. 5, the present invention is not limited thereto. For example, the mounting unit 10 may apply the phthalate 300 to a contact portion of the first device 100. Also, according to embodiments, the phthalate 300 may be applied to both of contact portions of the first and second devices 100 and 200.

As illustrated in FIG. 5, the mounting unit 10 may apply the phthalate 300 to the contact portion of the second device 200 in a manner in which a liquid drop of the phthalate 300 is dropped onto the contact portion of the second device 200. However, as illustrated in FIG. 6, the mounting unit 10 may attach a stencil 220 having a hole 221 to the second device 200. The phthalate 300 is spread evenly on the stencil 220, thereby applying the phthalate 300 to the second device 200. According to the present embodiment, the hole 221 punched in the stencil 220 may be defined in a position that corresponds to the contact portion of the second device 200, e.g., the pad 210.

Then, referring to FIG. 7, the mounting unit 10 may move at least one of the first and second devices 100 and 200 to allow the first and second devices 100 and 200 to contact each other on the portion that is coated with the phthalate 300.

As above-described with reference to FIG. 3, to allow the first and second devices 100 and 200 to contact each other, the mounting unit 10 may move only the first device 100 or only the second device 100, or may move both of the first and second devices 100 and 200.

According to further another embodiment of the present invention, a mounting unit 10 may apply a film formed of phthalate 300 to at least one of first and second devices 100 and 200 to move at least one of the first and second devices 100 and 200 so that the first and second devices 100 and 200 contact each other on the portion to which the film is applied.

Figure 8:
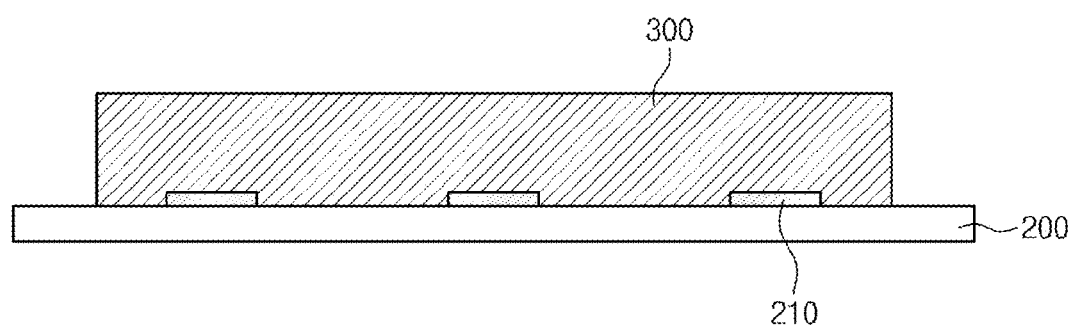
FIGS. 8 to 10 are views for explaining a process of mounting a device according to further another embodiment of the present invention.
Figure 9:
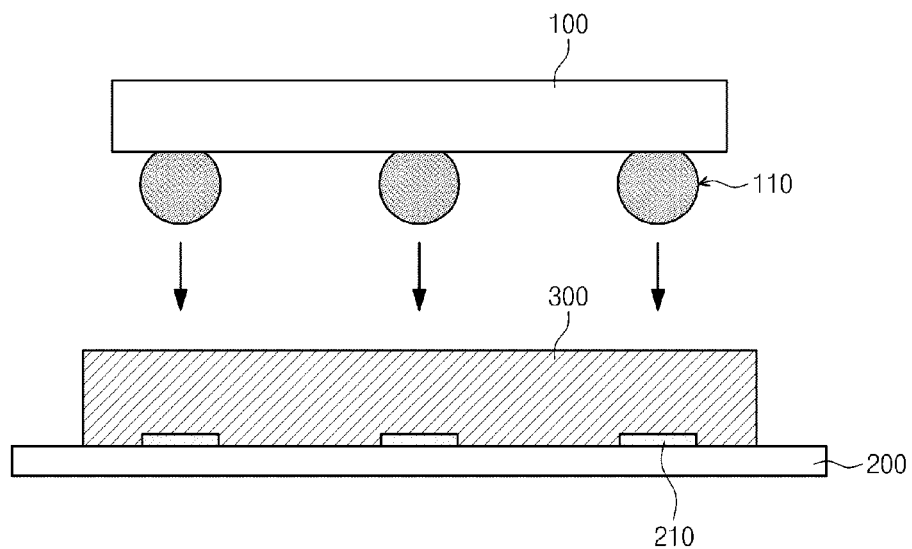
Figure 10:
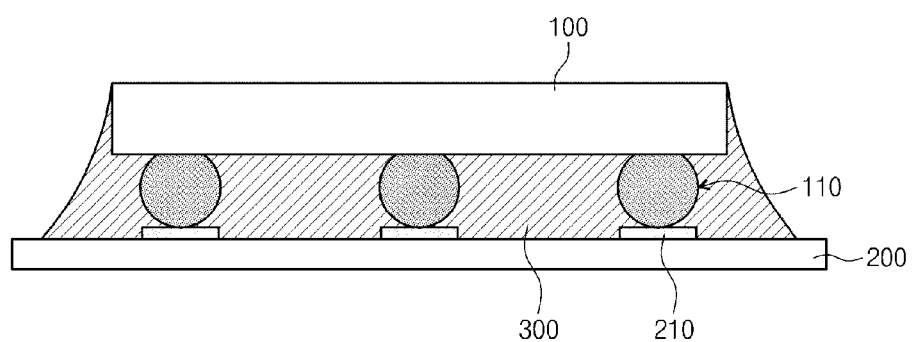

FIGS. 8 to 10 are views for explaining a process of mounting a device according to further another embodiment of the present invention.

Referring to FIG. 8, a mounting unit 10 may apply a film 300 formed of phthalate 300 to at least one of first and second devices 100 and 200. For example, as illustrated in FIG. 8, the mounting unit 10 may apply a film formed of phthalate 300 to a surface on which a pad 210 is disposed on the second device 200. For this, the mounting unit 10 may including a driving unit that moves the film toward the second device 200 to press the film onto the surface to which the film is applied.

Then, referring to FIG. 9, the mounting unit 10 may move at least one of the first and second devices 100 and 200 to allow the first and second devices 100 and 200 to contact each other on the portion to which the film is applied.

Similarly, to allow the first and second devices 100 and 200 to contact each other, the mounting unit 10 may move only the first device 100 or only the second device 100, or may move both of the first and second devices 100 and 200.

As a result, as illustrated in FIG. 10, a space between the first and second devices 100 and 20 may be filled with the phthalate 300. Here, the whole space may be filled with the phthalate 300, or only a portion of the space may be filled with the phthalate 300.

According to further another embodiment of the present invention, a mounting unit 10 may allow first and second devices 100 and 200 to contact each other and provide phthalate 300 on an edge of a contact portion between the first and second devices 100 and 200 to allow the phthalate 300 to be absorbed, stuck or wicked onto a boundary between the first and second devices 100 and 200.

Figure 11:
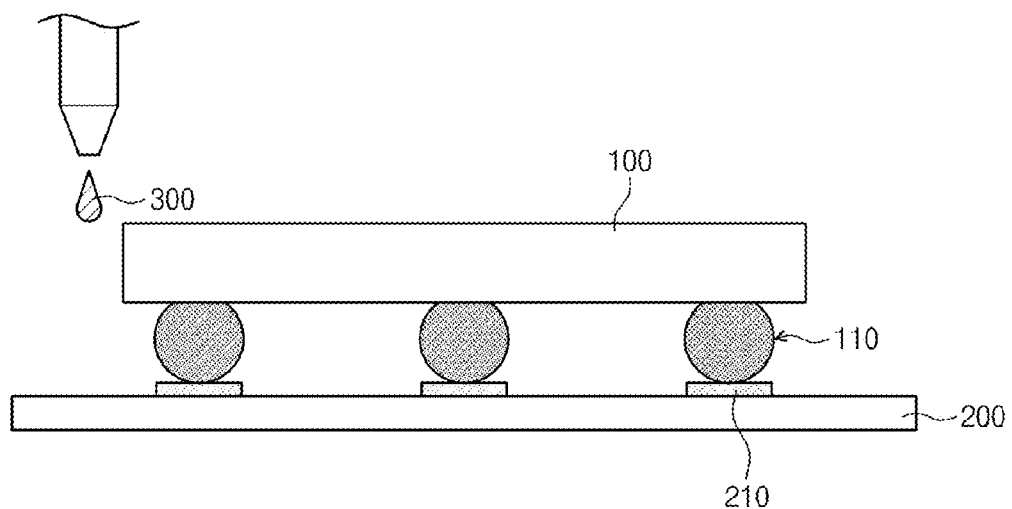
FIGS. 11 to 12 are views for explaining a process of mounting a device according to further another embodiment of the present invention.
Figure 12:
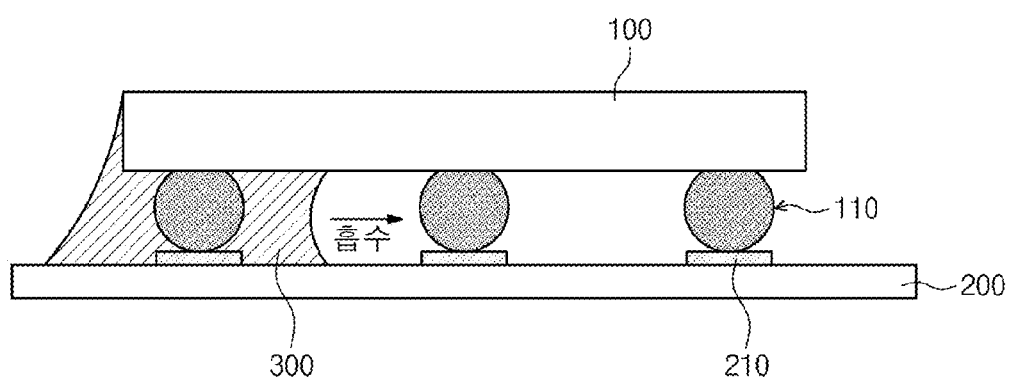

FIGS. 11 to 12 are views for explaining a process of mounting a device according to further another embodiment of the present invention.

According to an embodiment, the mounting unit 10 may contact the first and second devices 100 and 200 with each other and then provide the phthalate 300 on the contact portion between the first and second devices 100 and 200.

For example, the mounting unit 10 may drop a liquid drop of the phthalate 300 onto an edge of the contact portion between the first and second devices 100 and 200 to provide the phthalate 300 on the contact portion. According to embodiments, the phthalate 300 may be provided to a plurality of points on the edge of the contact portion.

As a result, as illustrated in FIG. 12, since the phthalate 300 is absorbed onto a boundary between the first and second devices 100 and 200 by a capillary phenomenon, the phthalate 300 may be filled into the whole or a portion of a space between the first and second devices 100 and 200.

The transfer unit 20 may transfer the first and second devices 100 and 200 that are attached to each other through the above-described mounting process to the processing unit 30. The transfer unit 20 may include a robot or conveyor that is disposed between the mounting unit 10 and the processing unit 30 to carry the first and second devices 100 and 200, but the present invention is not limited thereto. For example, a device for transferring the devices may be variously realized according to embodiments.

The processing unit 30 may process the transferred devices to remove the phthalate 300 and then fix the devices to each other, thereby completely the packaging process.

According to an embodiment of the present invention, the processing unit 30 may include a device processing apparatus that thermally processes the first and second devices 100 and 200 attached to each other by using the phthalate 300, to remove the phthalate 300 and then fix the first and second devices 100 and 200 to each other.

Figure 13:
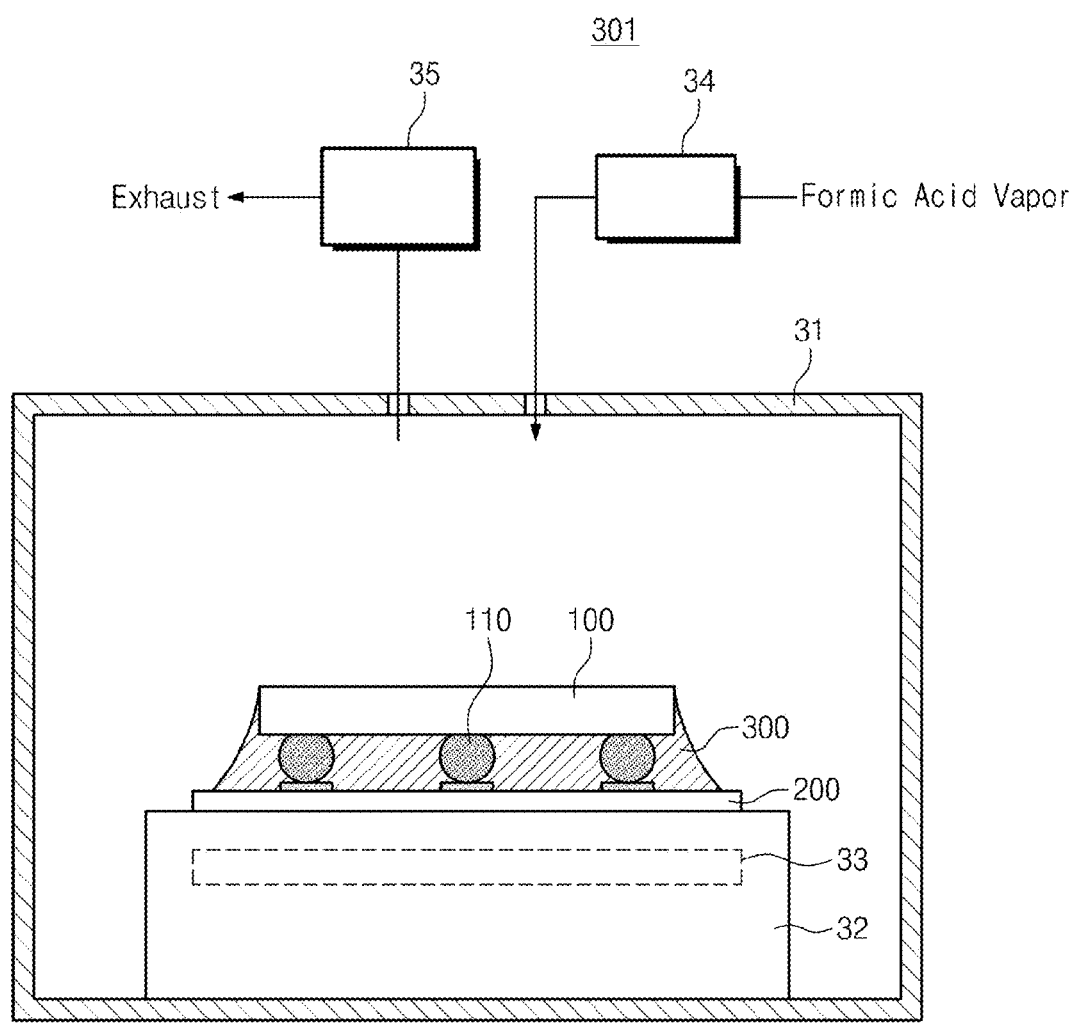
FIG. 13 is a view of a device processing apparatus according to an embodiment of the present invention.

FIG. 13 is a view of a device processing apparatus 301 according to an embodiment of the present invention.

Referring to FIG. 13, according to an embodiment, the device processing apparatus 301 may include a process chamber 31, a device support 32, and a heater 33.

The process chamber 31 may provide a space in which a device processing process is performed. The device support 32 may be disposed within the process chamber 31 to support the first and second devices 100 and 200 that are attached to each other. The heater 33 may heat the first and second devices 100 and 200 that are attached to each other.

According to an embodiment of the present invention, the processing unit 30 may preheat the first and second devices 100 and 200 that are attached to each other at a first temperature to remove phthalate 300, heat the first and second devices 100 and 200 at a second temperature that is greater than the first temperature to melt a bonding material disposed on a contact portion between the first and second devices 100 and 200, and cool the first and second devices 100 and 200 at a third temperature that is less than the second temperature to solidify the bonding material 110.

Figure 14:
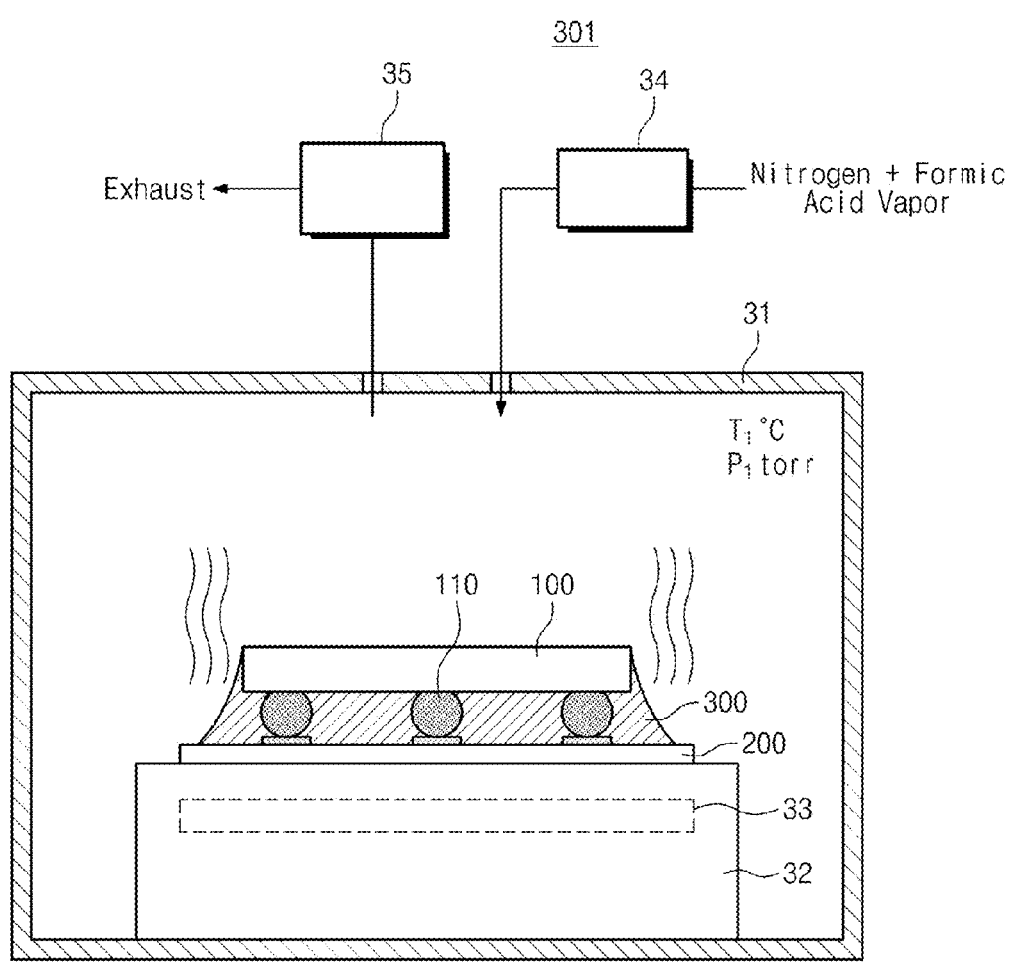
FIG. 14 is a view for explaining a process of removing phthalate according to an embodiment of the prevent invention.

FIG. 14 is a view for explaining a process of removing phthalate 300 according to an embodiment of the prevent invention.

Referring to FIG. 14, the processing unit 30 may preheat the devices at a first temperature T1 to remove phthalate 300 disposed between the devices before the devices are bonded to each other. For this, the heater 33 may preheat the first and second devices 100 and 200 that are attached to each other at the first temperature T1.

According to the present embodiment, the first temperature T1 may be lower than a boiling point of the phthalate 300.

Particularly, the heater 33 may preheat the first and second devices 100 and 200 that are attached to each other at a temperature of about 180° C. to about 220° C. to remove the phthalate 300. In this case, the heater 33 may preheat the first and second devices 100 and 200 that are attached to each other at a temperature of about 180° C. to about 220° C. for about 60 seconds or more.

According to an embodiment of the present invention, when the preheating for removing the phthalate 300 is performed, an inner pressure P1 of the process chamber 31 may be maintained to the atmospheric pressure or a pressure that is less than the atmospheric pressure. For this, the device processing apparatus 301 may include a pressure control part 35 for controlling the inner pressure of the process chamber 31. The pressure control part 35 may control and maintain the inner pressure of the process chamber 31 to a predetermined pressure by using an exhaust unit such as a pump or compressor.

According to an embodiment of the present invention, when the preheating for removing the phthalate 300 is performed, dry nitrogen or nitrogen containing formic acid vapor may be supplied into the process chamber 31. For this, the device processing apparatus 301 may include a supply part 34 such as bubbler or acid vapor delivery for supplying a fluid required for the process into the process chamber 31. The fluid supply part 34 may supply the fluid from a storage container in which the fluid is stored into the process chamber 31 through a tube. Also, a flow rate control unit such as a valve may be disposed in the tube to control a flow rate of the supplied fluid.

According to an embodiment, the phthalate 300 provided to a boundary between the first and second devices 100 and 200 to bond the first and second devices 100 and 200 to each other may be phase-changed into a gas through the preheating and then be discharged out of the process camber 31. To remove the phthalate 300, a nitrogen gas or a mixed gas of nitrogen and formic acid may be used as the process fluid.

After the phthalate 300 is removed, the processing unit 30 may heat the first and second devices 100 and 200 at a second temperature that is greater than the first temperature T1 to melt a bonding material 110 disposed on a contact portion between the first and second devices 100 and 200 and then cool the first and second devices 100 and 200 at a third temperature that is less than the second temperature to solidify the bonding material 110.

Figure 15:
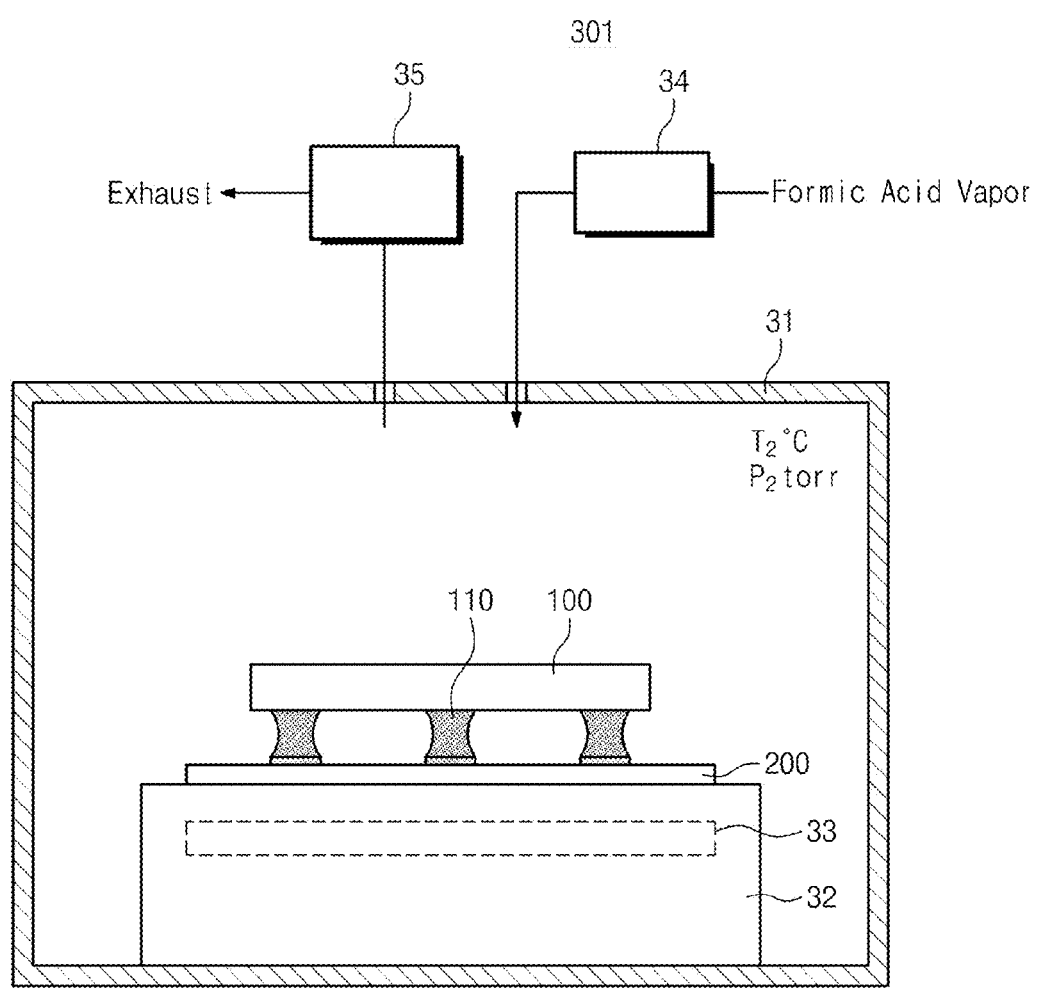
FIGS. 15 and 16 are views for explaining a process of bonding first and second devices to each other according to an embodiment of the prevent invention.
Figure 16:
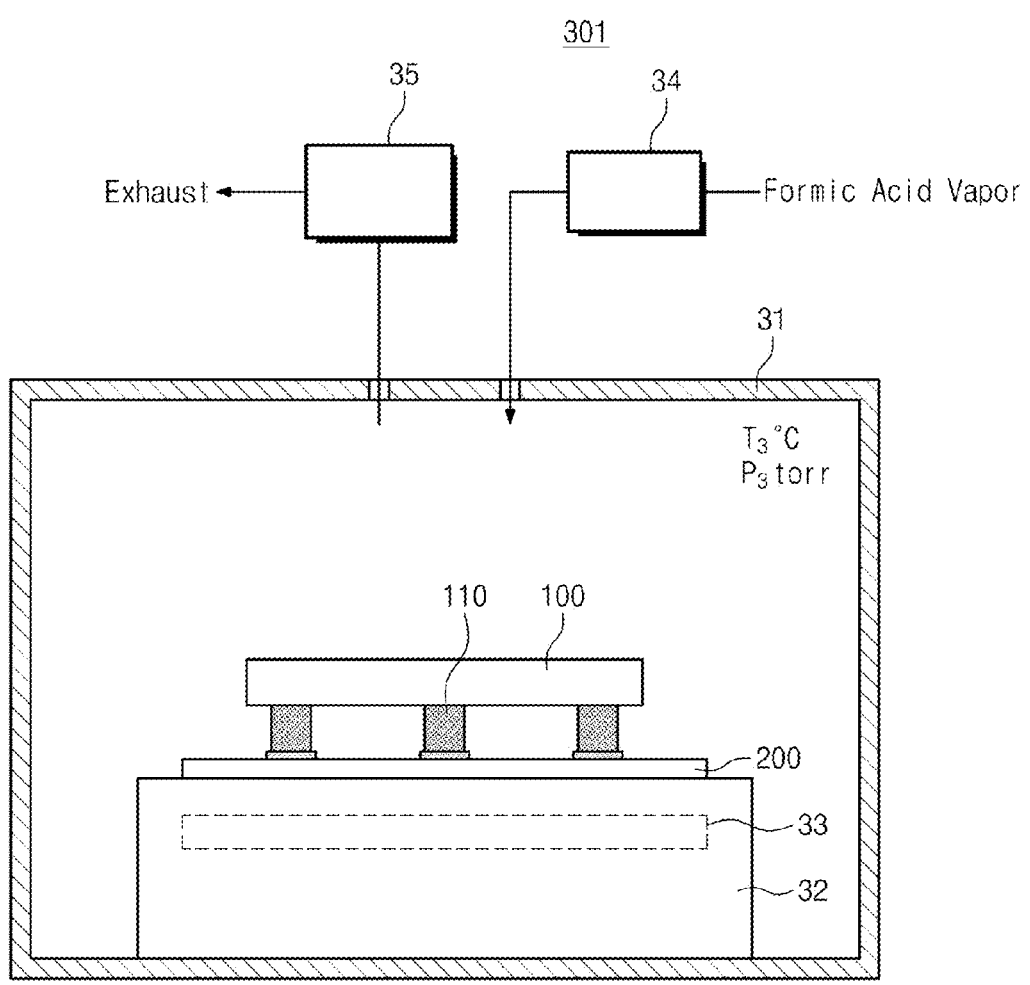

FIGS. 15 and 16 are views for explaining a process of bonding first and second devices 100 and 200 to each other according to an embodiment of the prevent invention.

Referring to FIG. 15, the processing unit 30 may heat the first and second devices 100 and 200 from which the phthalate 300 is removed at a second temperature T2 that is greater than the first temperature T1 to melt the bonding material 110 disposed on the contact portion between the first and second devices 100 and 200.

For this, the heater 33 may heat the first and second devices 100 and 200 at the second temperature T2. As a result, the bonding material 110 disposed between the first and second devices 100 and 200, for example, a solder bump may be melted to be formed on the boundary between the first and second devices 100 and 200.

Here, the supply part 34 may supply formic acid into the process chamber 31. Also, the pressure control part 35 may maintain an inner pressure P1 of the process chamber 31 to the atmospheric pressure or a pressure that is less than the atmospheric pressure.

Then, referring to FIG. 16, the processing unit 30 may cool the first and second devices 100 and 200 at a third temperature T3 that is less than the second temperature T2 to solidify the bonding material 110. As a result, the first and second devices 100 and 200 may be fixed and bonded to each other by the bonding material 110.

Here, the second temperature T2 is greater than or equal to the melting point of the bonding material 110, and the third temperature T3 may be less than the melting point of the bonding material 110. The second temperature T2 and the third temperature T3 may vary according to kinds of bonding materials 110. The bonding material 110 may include different kinds of metal, metal alloy, resin containing metal, and the like in addition to the solder as described above.

According to another embodiment of the present invention, the processing unit 30 may heat the first and second devices 100 and 200 at a fourth temperature that is less than the first temperature under the atmospheric pressure or a pressure that is less than the atmospheric pressure while exposing the first and second devices 100 and 200 to formic acid vapor after removing the phthalate 300 to remove impurities formed on a surface of the bonding material 110.

Figure 17:
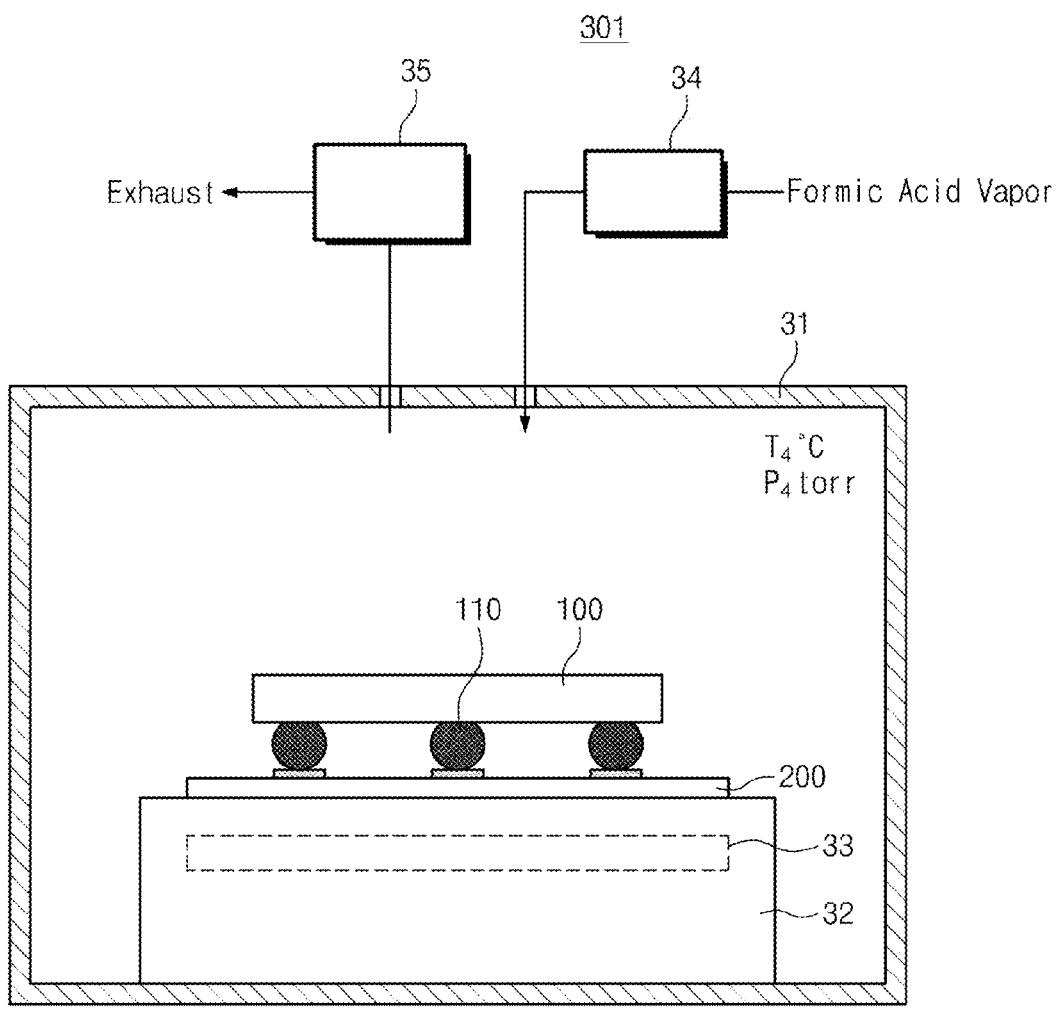
FIG. 17 is a view for explaining a process of removing impurities remaining on a bonding material after phthalate is removed according to another embodiment of the present invention.

FIG. 17 is a view for explaining a process of removing impurities remaining on a bonding material 110 after phthalate is removed according to another embodiment of the present invention.

Referring to FIG. 17, the processing unit 30 may thermally process the first and second devices 100 and 200 at a fourth temperature T4 to additionally perform a process of removing impurities formed on a surface of the bonding material 110 before melting the bonding material 110 after performing preheating to remove phthalate 300 between the first and second devices 100 and 200.

For this, the heater 330 may heat the first and second devices 100 and 200 at the fourth temperature T4 that is greater than the first temperature T1. Also, the fluid supply part 34 may supply formic acid into the process chamber 31. According to embodiments, the fluid supply part 34 may supply nitrogen containing formic acid vapor. Also, the pressure control part 35 may maintain an inner pressure P4 of the process chamber 31 to the atmospheric pressure or a pressure that is less than the atmospheric pressure.

The impurities may be materials formed on a surface of the bonding material 110. Also, when the impurities are melted together with the bonding material 110 and then are included in the bonding portion between the first and second devices 100 and 200, the impurities may be materials that deteriorate performance of the devices. For example, when the bonding material 110 is metal, the impurities may be metal oxide.

As described above, the first and second devices 100 and 200 that are fixed to each other through the removal of the phthalate 300 and the melting and solidifying of the bonding material 110 may take out of the device packaging facility to complete the packaging process.

That is to say, unlike the typical packaging process using flux for bonding devices to each other, in the packaging process using the phthalate according to the embodiments of the present invention, the bonding material may be preheated to remove the phthalate before the bonding material is melted. Thus, it is unnecessary to perform separate cleaning and drying processes.

As a result, in the packaging process according to the embodiment of the present invention, the process number may be reduced, the production process may be simplified, and the manufacturing costs may be reduced when compared to those of the typical packaging process.

As described above, the packaged devices may be directly transferred into an inspection facility for the inspection without performing the cleaning and drying processes.

Figure 18:
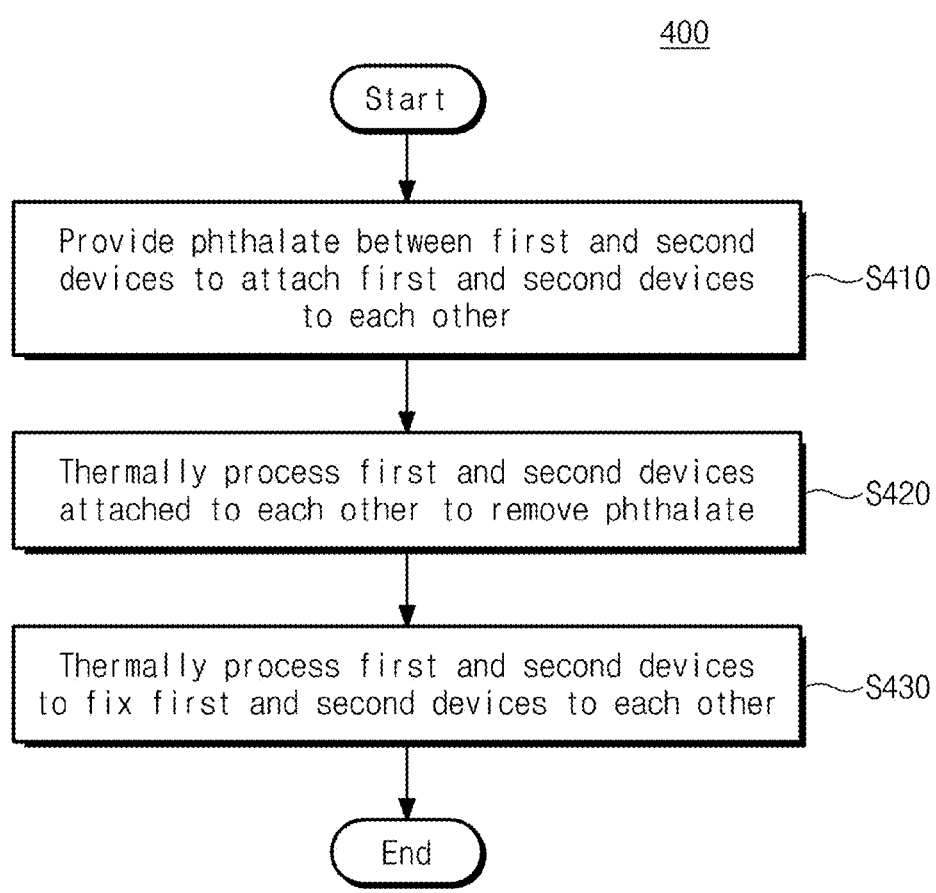
FIG. 18 is a flowchart illustrating a device packaging process according to an embodiment of the present invention.

FIG. 18 is a flowchart illustrating a device packaging process 400 according to an embodiment of the present invention.

The device packaging process 400 may be performed by the device packaging facility 1 according to the foregoing embodiments of the present invention.

Referring to FIG. 18, the device packaging process 400 may include a process (S410) of providing phthalate 300 between first and second devices 100 and 200 to attach the first and second devices 100 and 200 to each other, a process (S420) of thermally processing the first and second devices 100 and 200 that are attached to each other to remove the phthalate 300, and a process (S430) of thermally processing the first and second devices 100 and 200 to fix the first and second devices 100 and 200 to each other.

The first device 100 may include at least one of a solder ball, a semiconductor chip, and a substrate, but is not limited thereto. The second device 200 may include at least one of a semiconductor chip and a substrate, but is not limited thereto.

The phthalate 300 may include at least one of DMP and DIBP.

Figure 19:
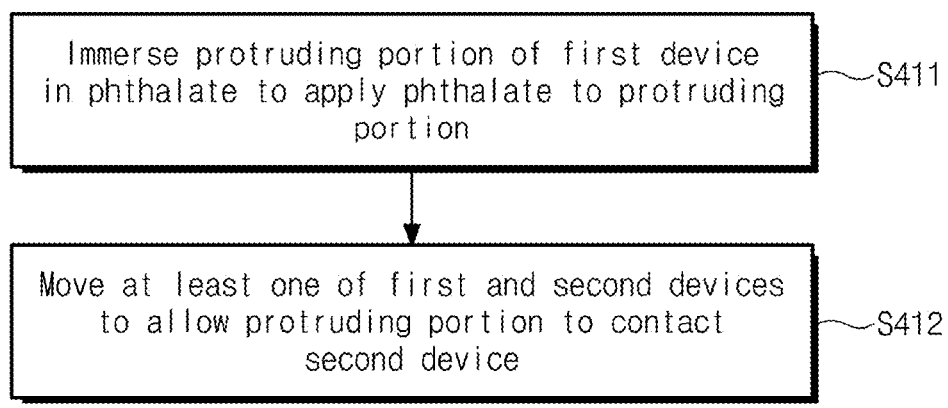
FIG. 19 is a flowchart for explaining a process of mounting a device according to an embodiment of the present invention.

FIG. 19 is a flowchart for explaining a process of mounting a device according to an embodiment of the present invention.

Referring to FIG. 19, according to an embodiment of the present invention, the process (S410) of attaching the first and second devices 100 and 200 to each other may include a process (S411) of immersing a protruding portion 110 of the first device 100 in the phthalate 300 to apply the phthalate 300 to the protruding portion 110 and a process (412) of moving at least one of the first and second devices 100 and 200 to allow the protruding portion 110 to contact the second device 200.

Figure 20:
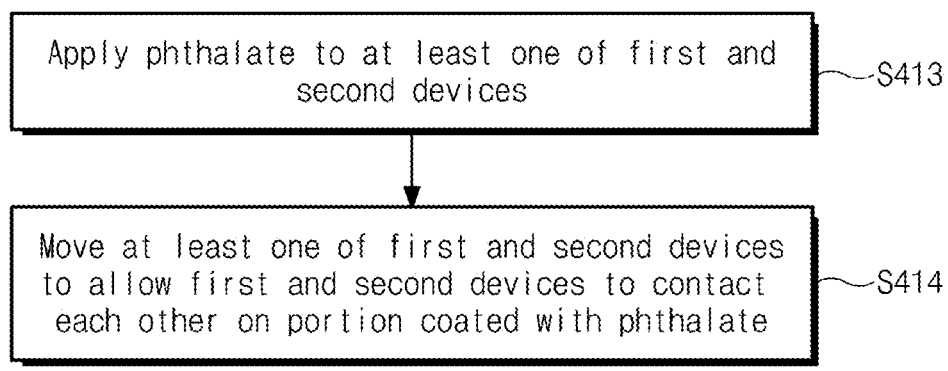
FIG. 20 is a flowchart for explaining a process of mounting a device according to another embodiment of the present invention.

FIG. 20 is a flowchart for explaining a process of mounting a device according to another embodiment of the present invention.

Referring to FIG. 20, according to another embodiment of the present invention, the process (S410) of attaching the first and second devices 100 and 200 to each other may include a process (S413) of applying the phthalate 300 to at least one of the first and second devices 100 and 200 and a process (S414) of moving at least one of the first and second devices 100 and 200 to allow the first and second devices 100 and 200 to contact each other on the portion coated with the phthalate 300.

Figure 21:
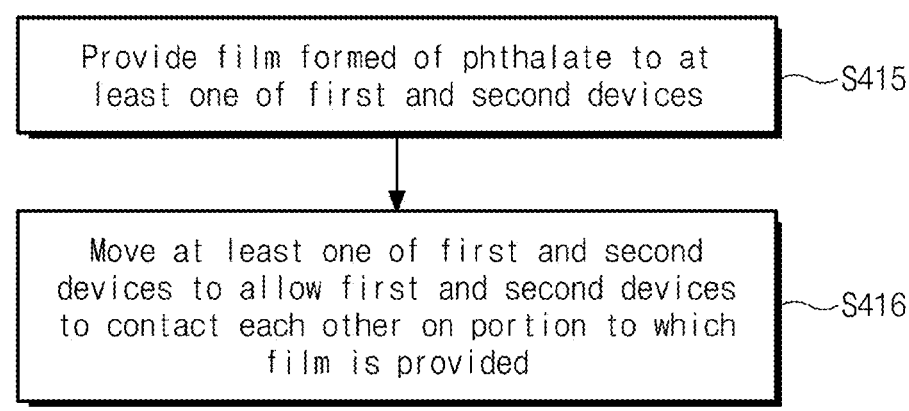
FIG. 21 is a flowchart for explaining a process of mounting a device according to further another embodiment of the present invention.

FIG. 21 is a flowchart for explaining a process of mounting a device according to further another embodiment of the present invention.

Referring to FIG. 21, according to further another embodiment of the present invention, the process (S410) of attaching the first and second devices 100 and 200 to each other may include a process (S415) of providing a film formed of the phthalate 300 to at least one of the first and second devices 100 and 200 and a process (S416) of moving at least one of the first and second devices 100 and 200 to allow the first and second devices 100 and 200 to contact each other on the portion to which the film is provided.

Figure 22:
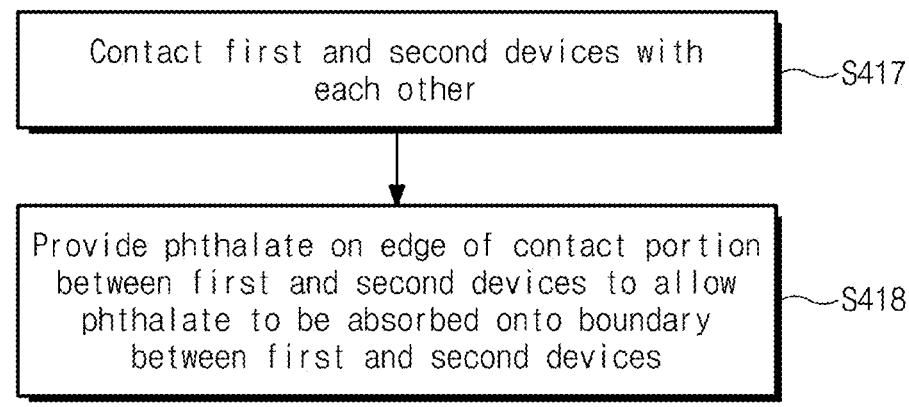
FIG. 22 is a flowchart for explaining a process of mounting a device according to further another embodiment of the present invention.

FIG. 22 is a flowchart for explaining a process of mounting a device according to further another embodiment of the present invention.

Referring to FIG. 22, according to further embodiment of the present invention, the process (S410) of attaching the first and second devices 100 and 200 to each other may include a process (S417) of allowing the first and second devices 100 and 200 to contact each other and a process (S418) of providing the phthalate 300 to an edge of the contact portion between the first and second devices 100 and 200 to allow the phthalate 300 to be absorbed onto a boundary between the first and second devices 100 and 200.

According to an embodiment of the present invention, the process (S420) of removing the phthalate 300 may include a process of preheating the first and second devices 100 and 200 that are attached to each other at a first temperature T1 to remove the phthalate 300.

According to an embodiment of the present invention, the process (S430) of fixing the first and second devices 100 and 200 to each other may include a process of heating the first and second devices 100 and 200 at a second temperature T2 that is greater than the first temperature T1 to melt a bonding material 110 disposed on the contact portion between the first and second devices 100 and 200 and a process of cooling the first and second devices 100 and 200 at a third temperature T3 that is less than the second temperature T2 to solidify the bonding material 110.

The first temperature T1 may be lower than a boiling point of the phthalate 300.

The second temperature T2 is greater than or equal to the melting point of the bonding material 110, and the third temperature T3 may be less than the melting point of the bonding material 110.

According to an embodiment of the present invention, the process (S420) of removing the phthalate 300 may include a process of preheating the first and second devices 100 and 200 that are attached to each other at a temperature of about 180° C. to about 220° C.

According to an embodiment, the process of preheating the first and second devices 100 and 200 may include a process of preheating the first and second devices 100 and 200 at the temperature of about 180° C. to about 220° C. for about 60 seconds or more.

According to an embodiment of the present invention, the process (S420) of removing the phthalate 300 may include a process of preheating the first and second devices 100 and 200 that are attached to each other under the atmospheric pressure or a pressure that is less than the atmospheric pressure.

According to an embodiment of the present invention, the process (S420) of removing the phthalate 300 may include a process of preheating the first and second devices 100 and 200 that are attached to each other at the first temperature T1 while exposing the first and second devices 100 and 200 to nitrogen or nitrogen containing formic acid vapor.

According to an embodiment, the device packaging process 400 may further include a process of heating the first and second devices 100 and 200 at a fourth temperature T4 that is greater than the first temperature T1 under the atmospheric pressure or the pressure that is less than the atmospheric pressure while exposing the first and second devices 100 and 200 to nitrogen or nitrogen containing formic acid vapor to remove impurities formed on the surface of the bonding material 110 after the process (S42) of removing the phthalate 300.

The first and second devices that are fixed to each other through the above-described processes may be taken out of the device packaging facility 1 to complete the packaging. The packaged devices may be directly transferred into an inspection facility for the inspection without performing the cleaning and drying processes.

According to the embodiments of the present invention, the phthalate instead of the flux may be used in the packaging process to minimize the effects on the human body, equipment, and environments.

According to the embodiments of the present invention, the inspection may be directly performed without performing the cleaning and drying processes after the devices are bonded to each other to simplify the production process.

To confirm the adhesion strength of dimethyl phthalate (DMP) the inventors prepared samples in which a die (first device) and PCB coupon (second device) were attached using dimethyl phthalate (DMP) according to an embodiment of the present invention. Tests were conducted which subjected the samples to forces which might be encountered during production and cause movement of the die relative to the PCB coupon. The position of the die relative to the PCB was observed and recorded using an optical microscope. After each test the adhesion position of the die was compared to its initial adhesion position to determine whether or not it had moved. FIGS. 23 to 26B are images from this series of tests on the dimethyl phthalate (DMP) samples.

The series of adhesion tests consisted of five types of tests. It was determined whether the device changed position due to the mechanical motion of two types of reflow equipment, whether the device changed position while a person carried the device, whether the device changed position when an impact was applied to the device, and whether the device changed position while the device was transported by a vehicle.

Figure 23:
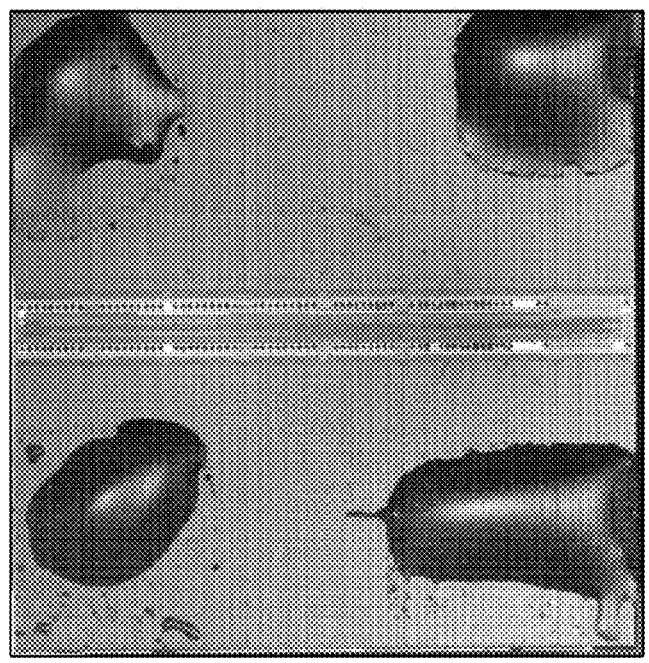
FIG. 23 is an optical microscope image showing the face of a die to which dimethyl phthalate (DMP) has been applied. The dimethyl phthalate (DMP) was applied to the corners of the die face with a dipping jig.
Figure 24:
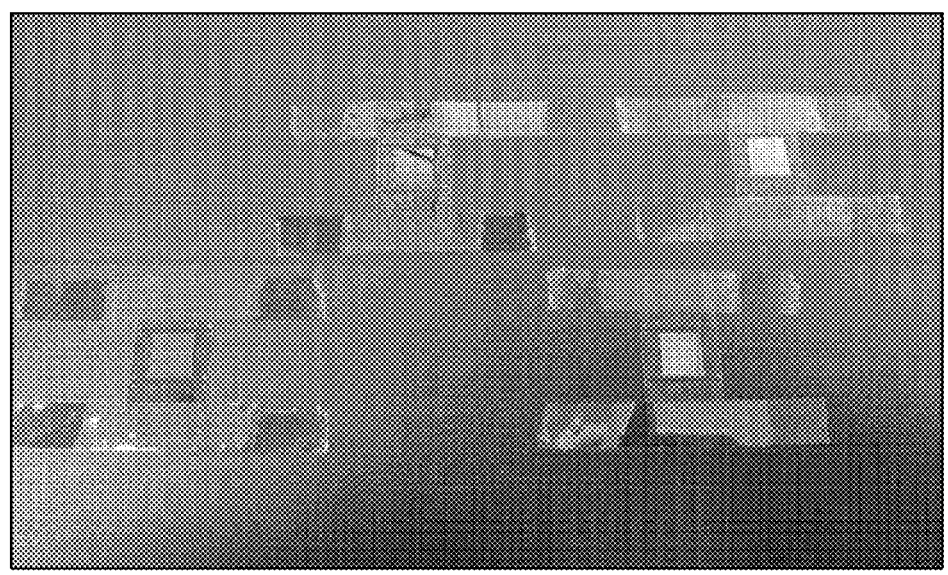
FIG. 24 is an image of a carrier plate on which samples of attached devices have been mounted.

First, as shown in FIG. 23, dimethyl phthalate (DMP) was applied to the corners of dies to attach the dies to PCB coupons as shown in FIG. 24. These samples were mounted on a carrier plate of the Vienna tool manufactured by SEMIgear, Inc., by using a Kapton tape, and then mechanically cycled in the Vienna tool. As part of this cycle, the samples underwent a load lock purge process which lasted for about 40 seconds.

Inspection showed that the adhesion position of the die relative to the PCB did not change during the Vienna cycle test.

Figure 25:
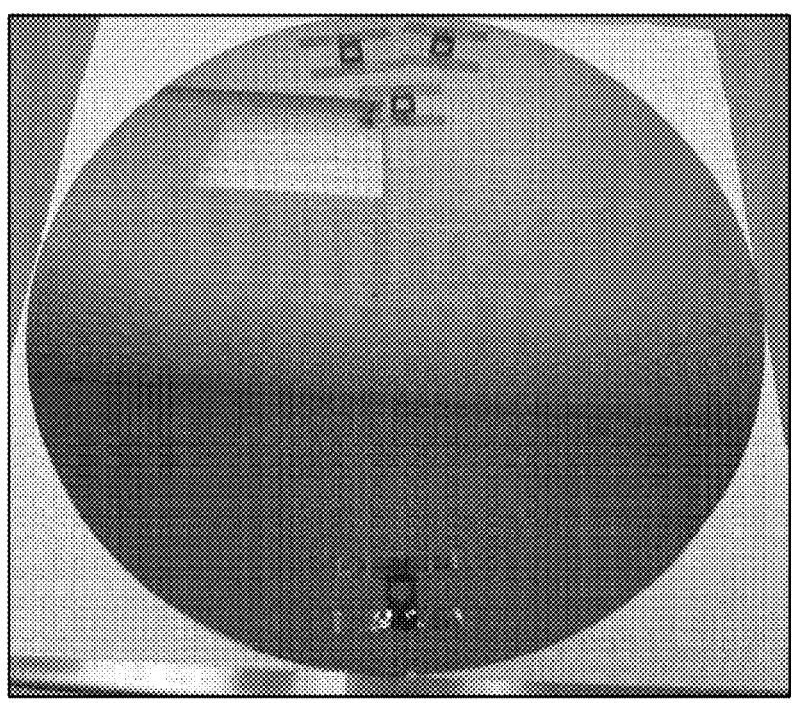
FIG. 25 is an image of a carrier wafer on which samples of attached devices have been mounted.

Also, as shown in the image of FIG. 25, the samples were mounted on a carrier wafer, and then a wafer transfer test was performed by using the Geneva tool manufactured by SEMIgear, Inc. As illustrated in FIG. 25, one of the four samples in each set was mounted on the carrier wafer at 6 o'clock position, corresponding to the wafer notch, and the other three samples were mounted on the carrier wafer at the 12 o'clock position.

The carrier wafer was first placed in the load lock of the Geneva where it underwent a 30 second purge cycle. The carrier wafer was then transferred five times between the carrier FOUP and the load lock using the Geneva's robot arm.

Inspection showed that the die did not change its adhesion position relative to the PCB during the Geneva cycle test.

The wafer to which the samples were attached was then carried around by hand for approximately 60 s. During this time the wafer was held vertically. Again, inspection showed no change in the adhesion position of the die during this test.

In the next test the carrier was wafer held vertically and struck 20 times by a person's hand. However, this still did not cause the adhesion position of the die to change.

Lastly, the carrier wafer with the attached samples was placed in a FOUP. This FOUP was loaded into the trunk of a vehicle which was subsequently driven around over the course of several days. Again, the adhesion position of the die relative to the PCB did not change.

Figure 26A:
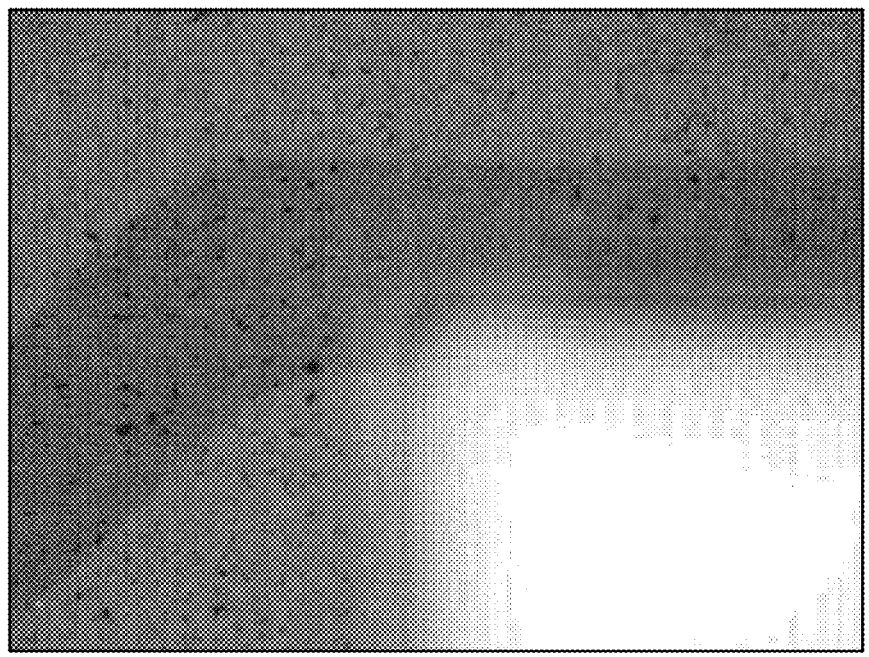
FIG. 26A is an optical microscope image showing the corner position of a die after it is attached to a PCB and FIG. 26B is an optical microscope image of the same corner after undergoing all movement tests.
Figure 26B:
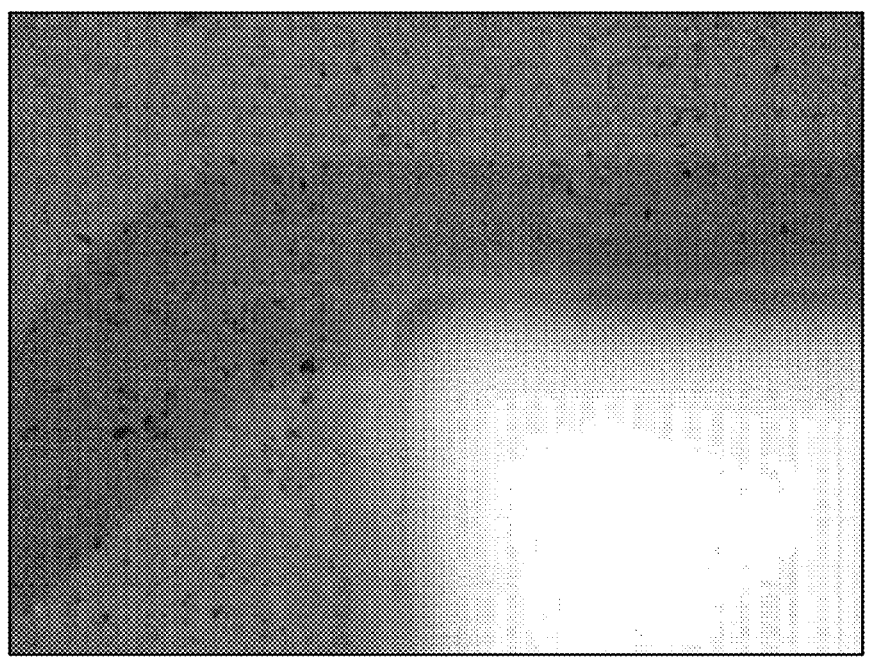
Figure 27A:
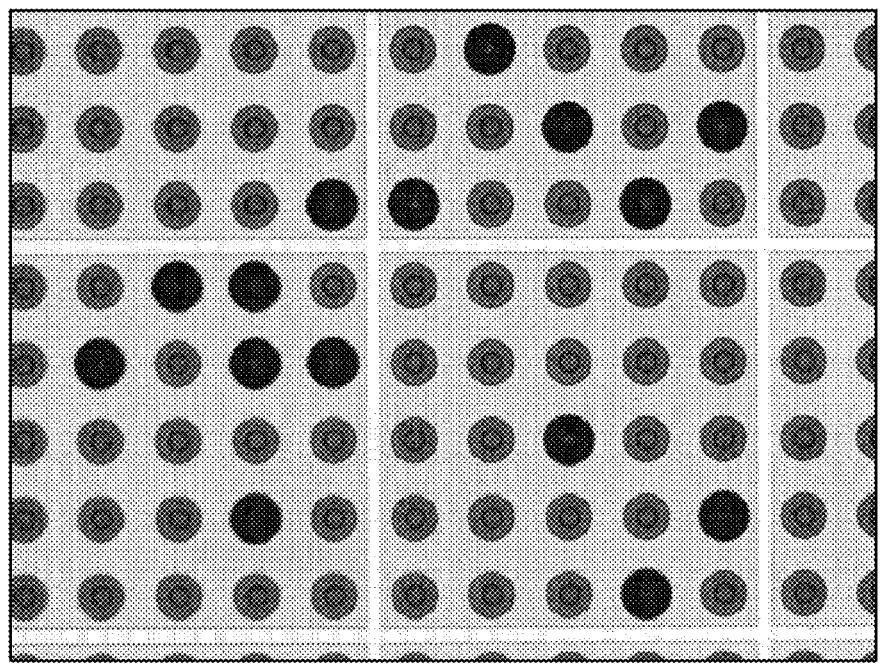
FIGS. 27A to 27D are optical microscope images of solder balls and copper pads on a silicon wafer after reflow. The solder balls were originally attached to the copper pads by using dimethyl phthalate (DMP).
Figure 27B:
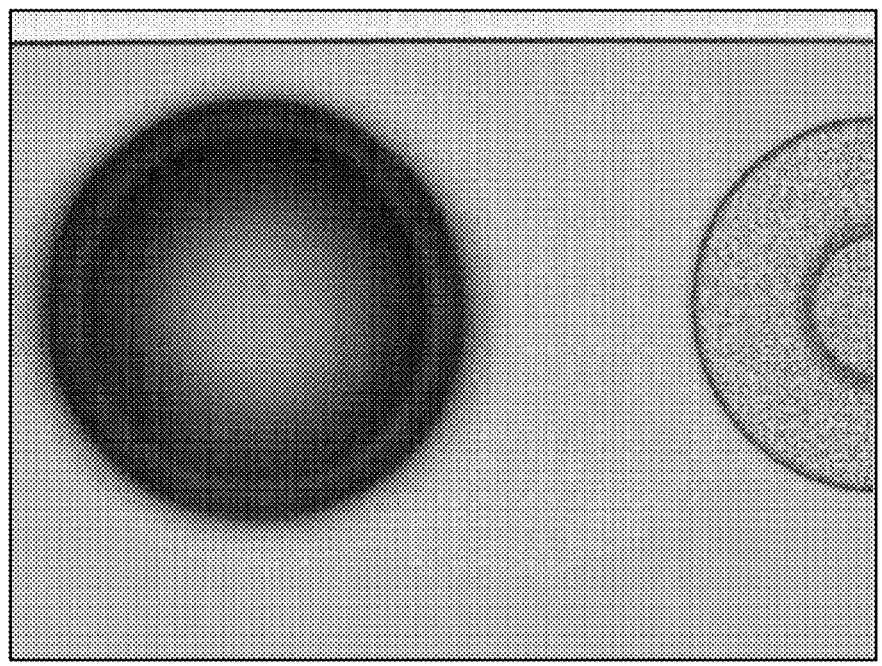
Figure 27C:
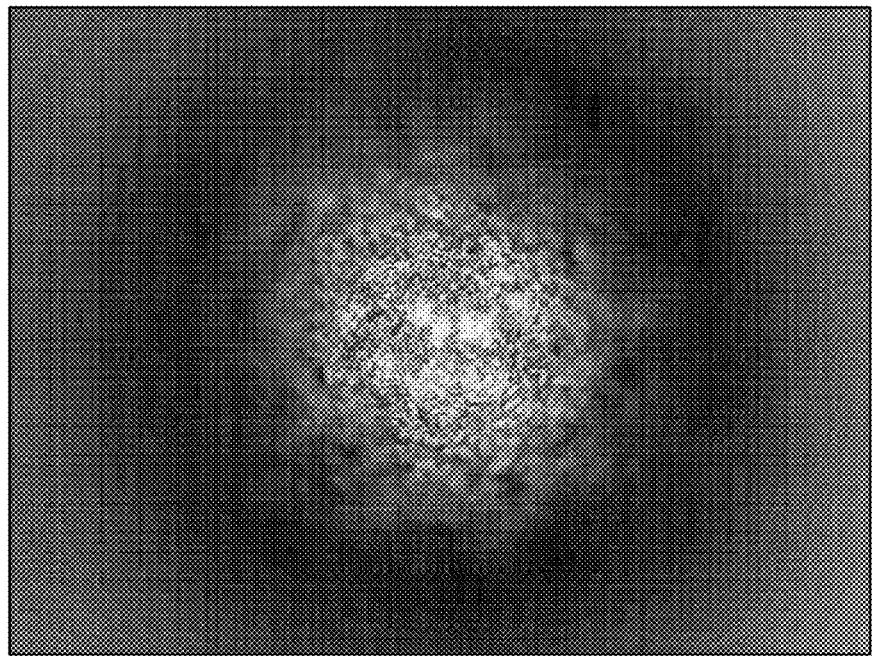
Figure 27D:
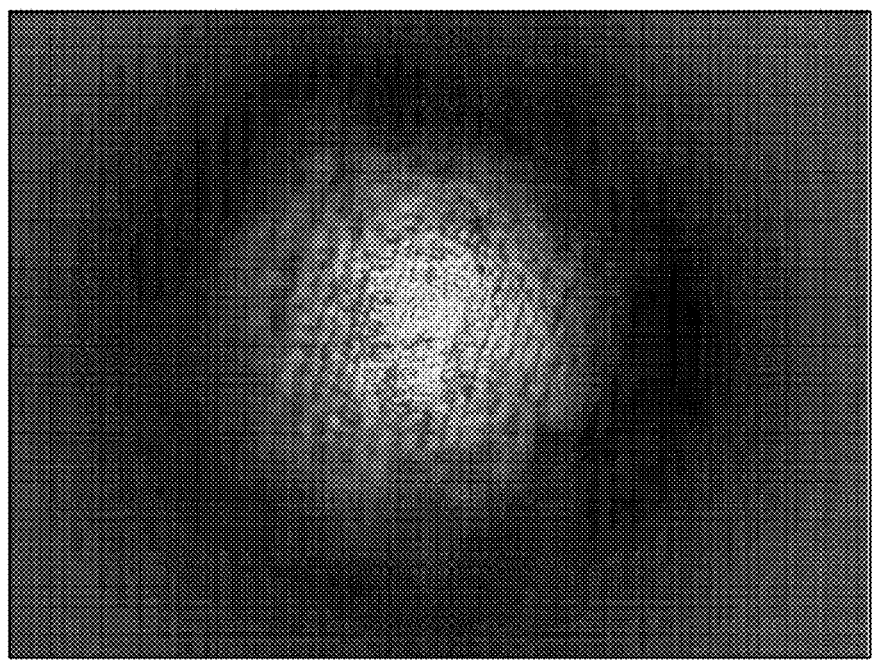

FIG. 26A is an optical microscope image showing a corner position of a die after a sample is produced, and FIG. 26B is an optical microscope image showing the same corner position of the die after the completion of all five adhesion tests.

As illustrated in FIGS. 26A and 26B, it was seen that the adhesion position of the die relative to the PCB did not change, but was maintained as it was transferred and subjected to various forces.

Similarly, when the same tests as the foregoing tests were performed on devices adhered using diisobutyl phthalate (DIBP) instead of dimethyl phthalate (DMP), it was determined that these dies also did not change their adhesion positions.

Through the described-above tests, it was confirmed that the devices are effectively fixed even when phthalate is used instead of flux.

Furthermore, the inventors confirmed that no phthalate residues remain on the devices even though separate cleaning and drying processes are not performed when the devices are attached by using the phthalate to perform the reflow process.

First, a solder ball was adhered to a copper pad by applying DMP to the copper pad and then placing the solder ball on top. The copper pad was part of a silicon wafer substrate. Here, the solder ball contains about 96.5% of tin, about 3% of silver, and about 0.5% of copper. Then, a reflow process was performed on the sample by using Geneva equipment manufactured by SEMIgear, Inc. Here, the reflow process was performed at a maximum temperature of about 235° C., and the maximum temperature was maintained for about 15 seconds.

The same reflow process, using the same equipment and processing conditions, was used to reflow a solder ball which was first adhered to the copper pad of a PCB using dimethyl phthalate (DMP).

Figure 28A:
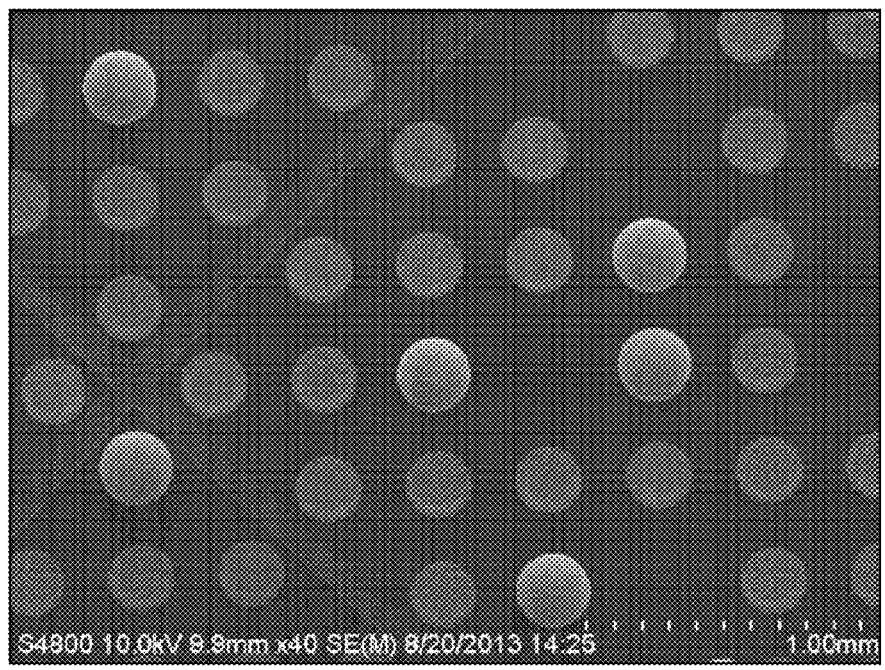
FIGS. 28A and 28B are scanning electron microscopy (SEM) images of solder balls and copper pads on a silicon wafer after reflow. The solder balls were originally attached to the copper pads by using dimethyl phthalate (DMP).
Figure 28B:
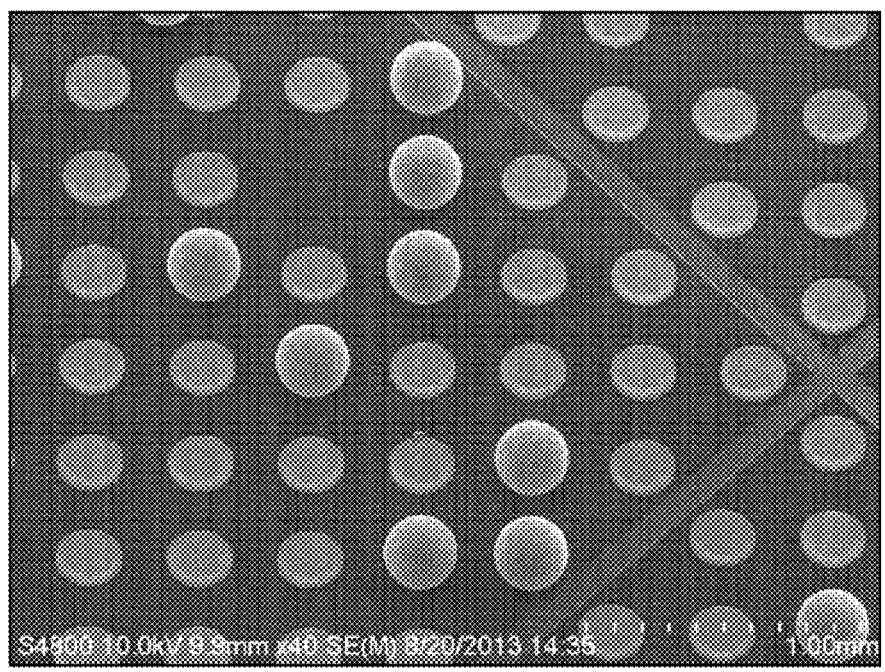
Figure 29A:
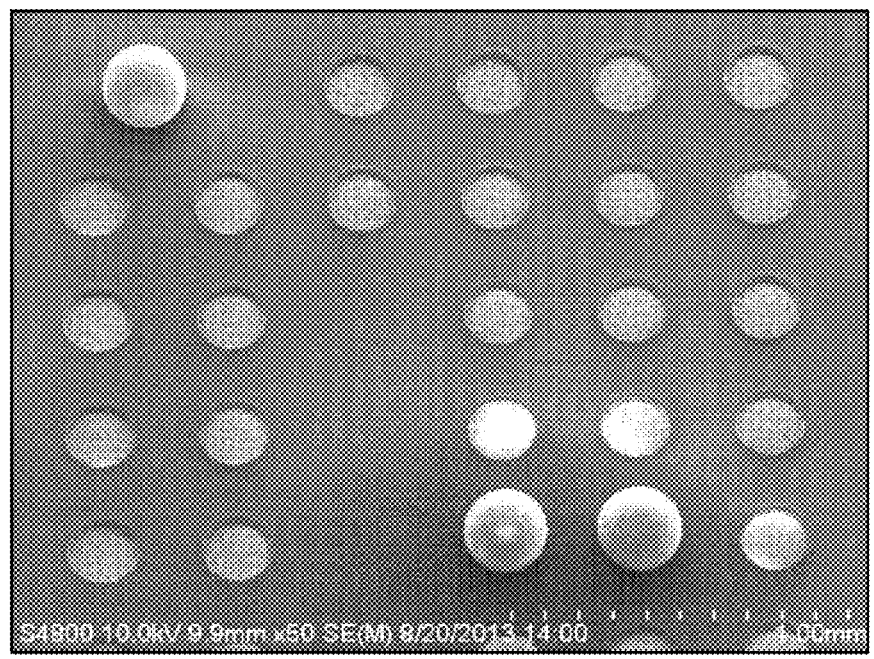
FIGS. 29A and 29B are SEM images of solder balls and copper pads on a PCB after reflow. The solder balls were originally attached to the coppers pads by using dimethyl phthalate (DMP).
Figure 29B:
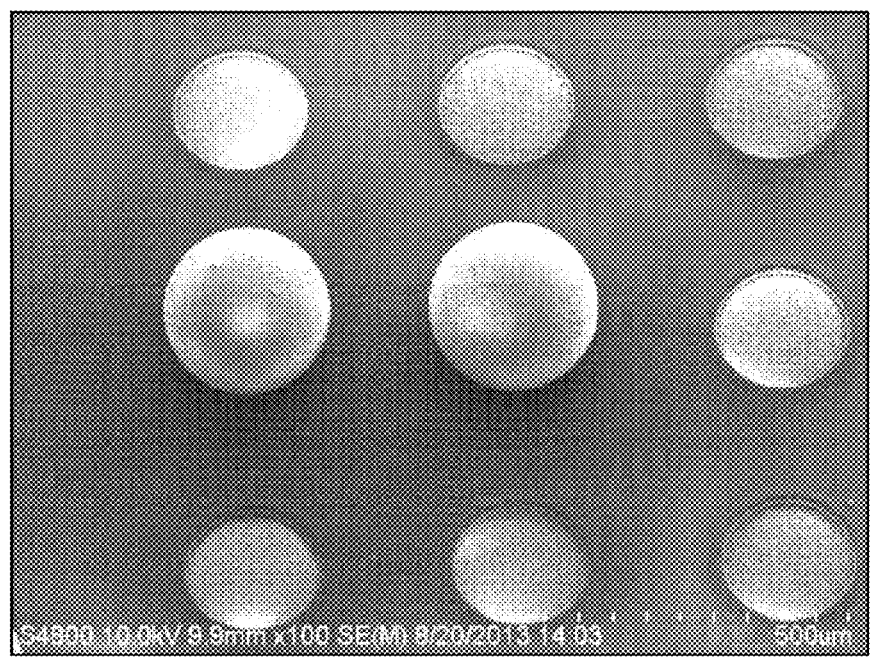
Figure 30A:
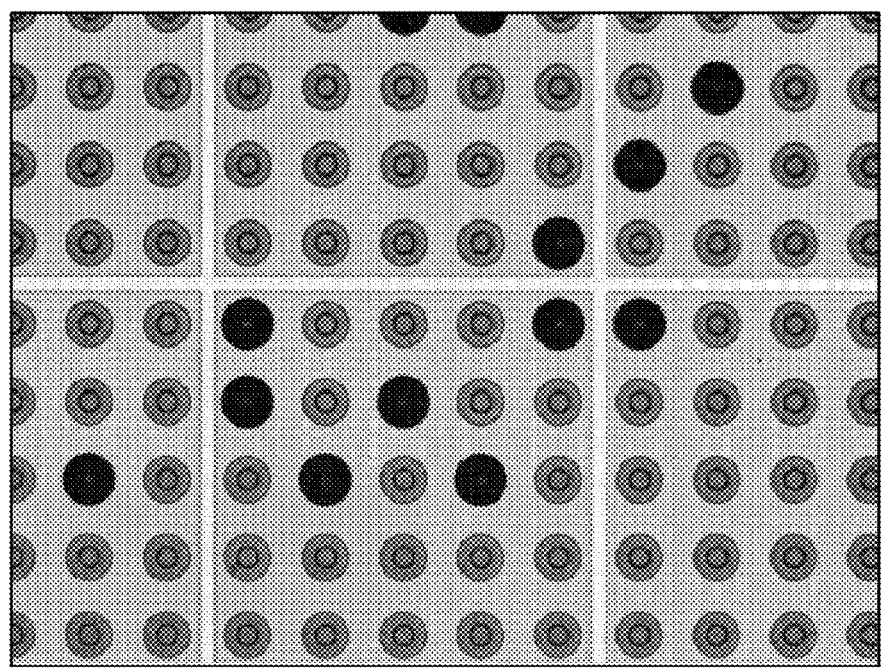
FIGS. 30A to 30D are optical microscope images of solder balls and copper pads on a silicon wafer after reflow. The solder balls were originally attached to the copper pads by using diisobutyl phthalate (DIBP).
Figure 30B:
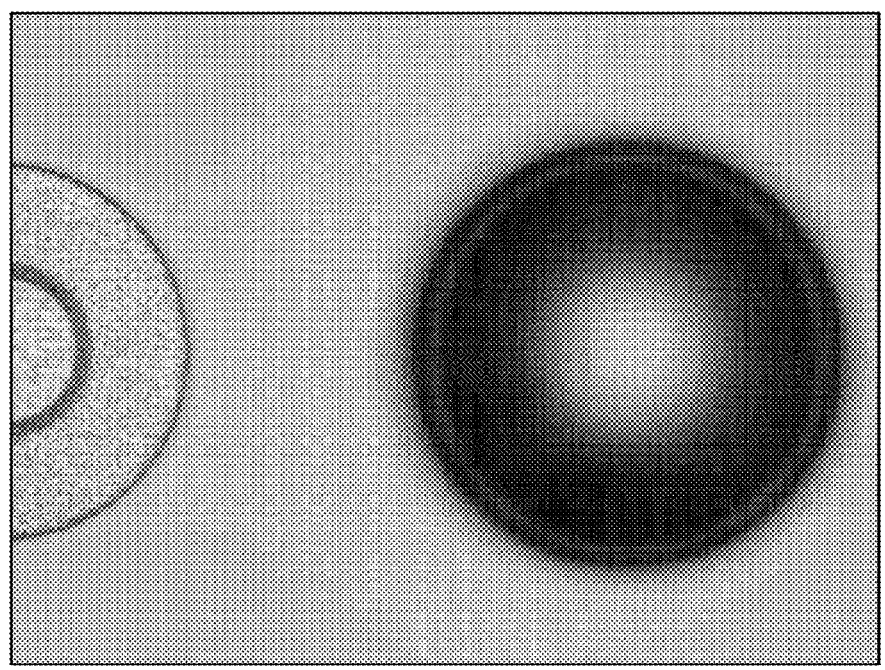
Figure 30C:
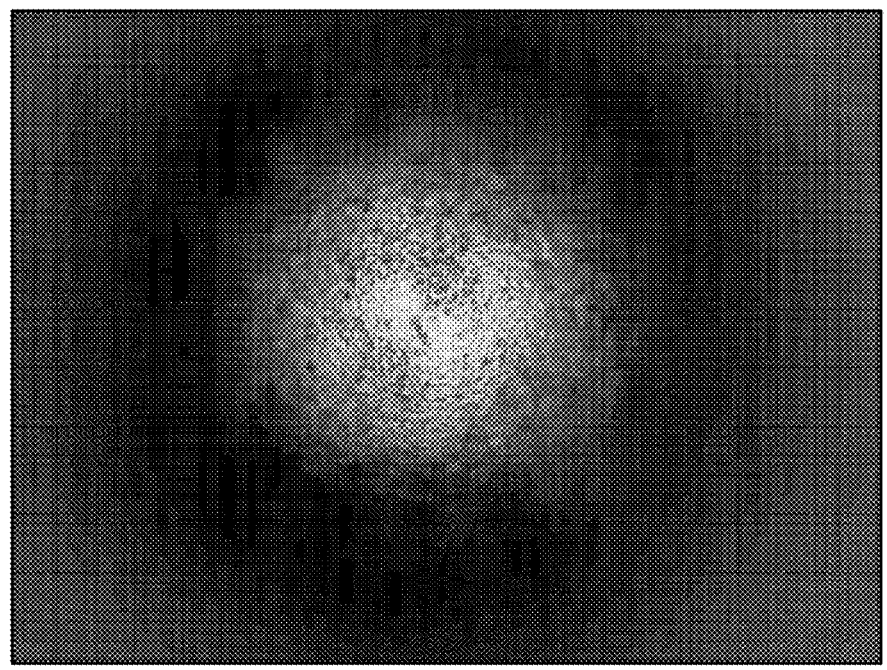
Figure 30D:
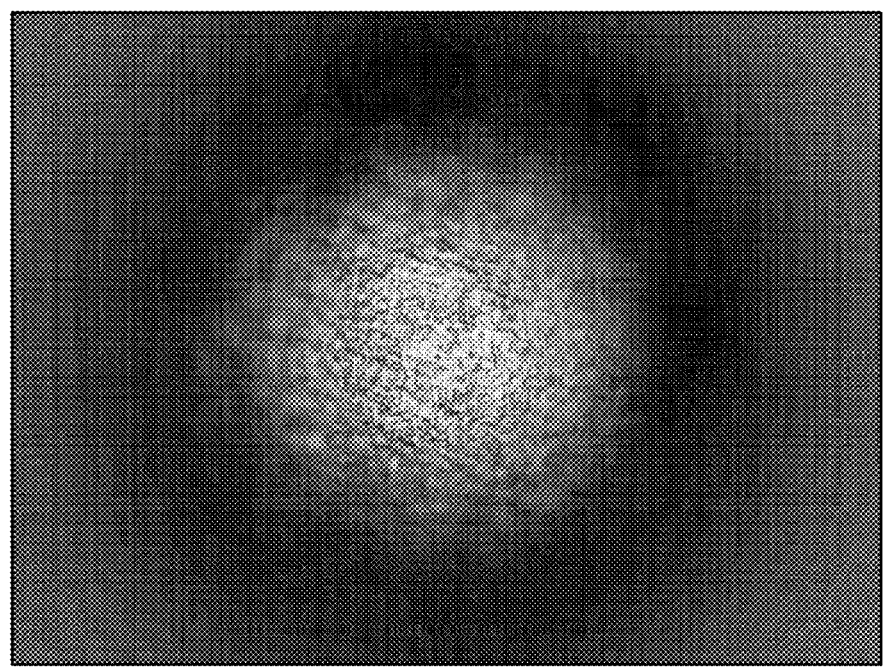

FIGS. 27A to 27D are optical microscope images of solder balls and copper pads on a silicon wafer after reflow, FIGS. 28A and 28B are scanning electron microscopy (SEM) images of solder balls and copper pads on a silicon wafer after reflow, and FIGS. 29A and 29B are SEM images of solder balls and copper pads on a PCB after reflow. All solder balls was first adhered to the copper pads by using dimethyl phthalate (DMP).

As illustrated in FIGS. 27 to 29, the solder balls had a smooth and rounded shape and were well aligned with the pads. Also, according to the observed result, the dimethyl phthalate (DMP) left no residue after the reflow process was performed.

Similarly, silicon wafer and PCB samples were reflowed using the same equipment and process conditions as above. However, diisobutyl phthalate (DIBP) was used instead of dimethyl phthalate (DMP) to adhere solder balls to copper pads on both samples.

Figure 31A:
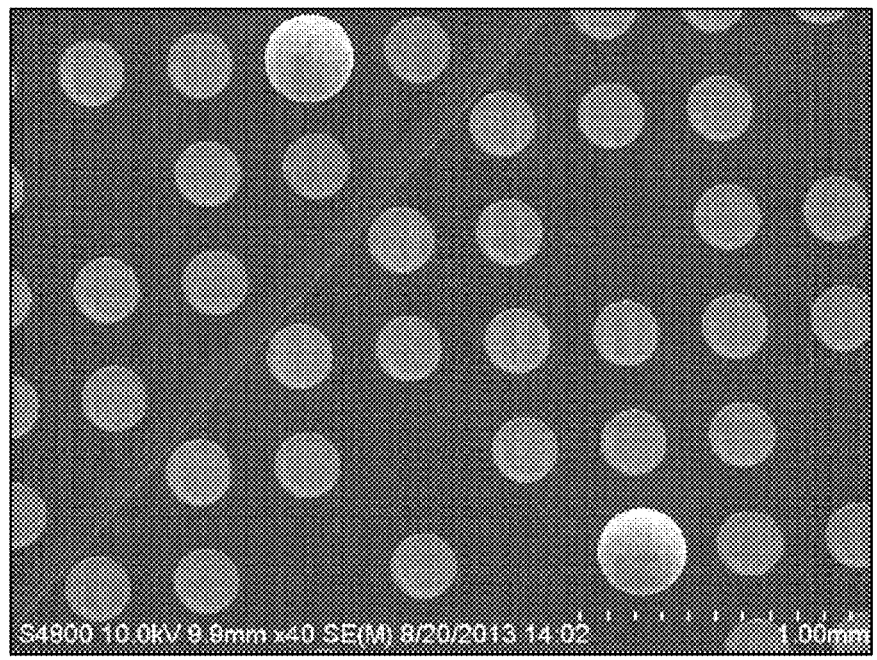
FIGS. 31A and 31B are SEM images of solder balls and copper pads on a silicon wafer after reflow. The solder balls were originally attached to the copper pads by using diisobutyl phthalate (DIBP).
Figure 31B:
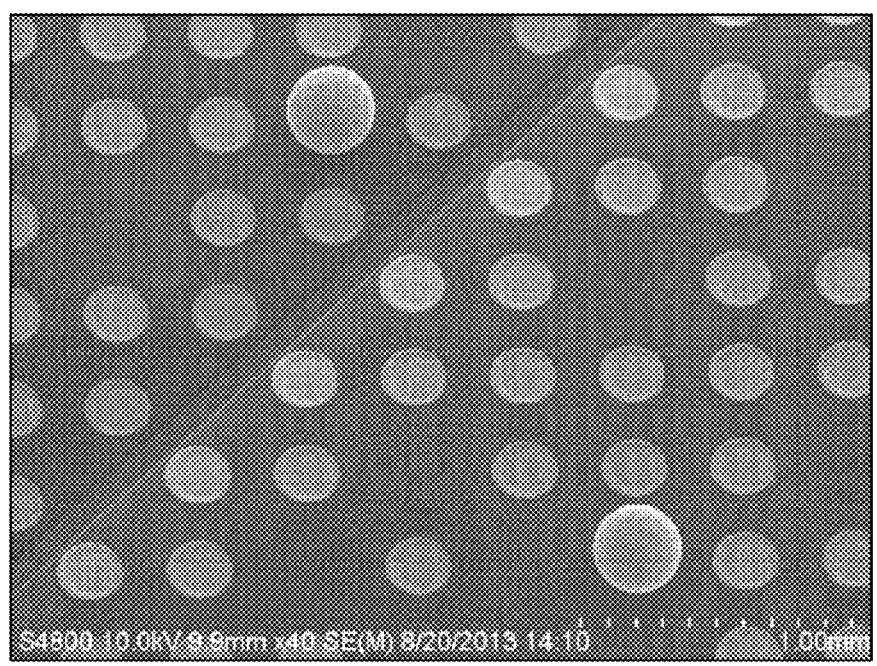
Figure 32A:
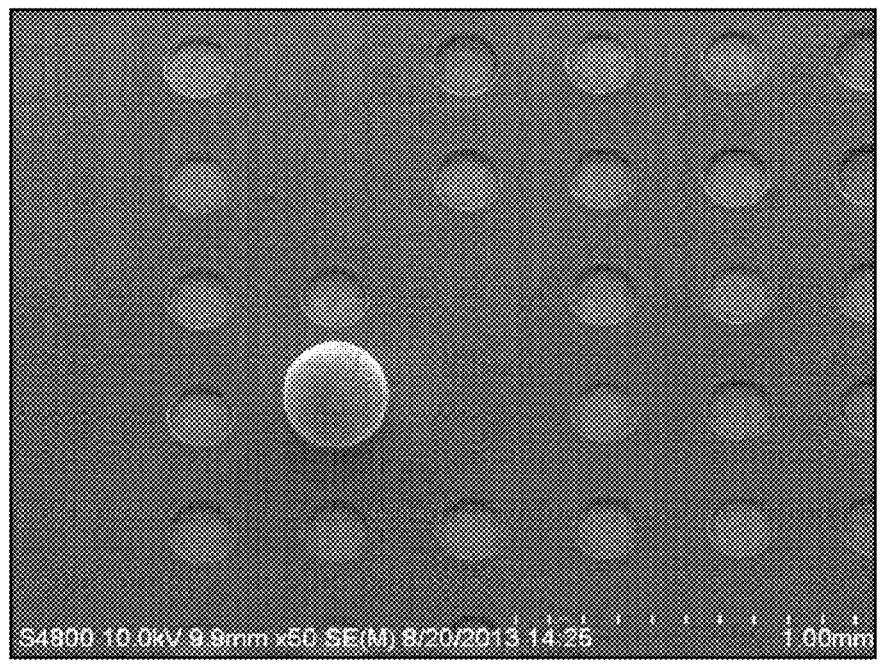
FIGS. 32A and 32B are SEM images of solder balls and copper pads on a PCB after reflow. The solder balls were originally attached to the coppers pads by using diisobutyl phthalate (DIBP).
Figure 32B:
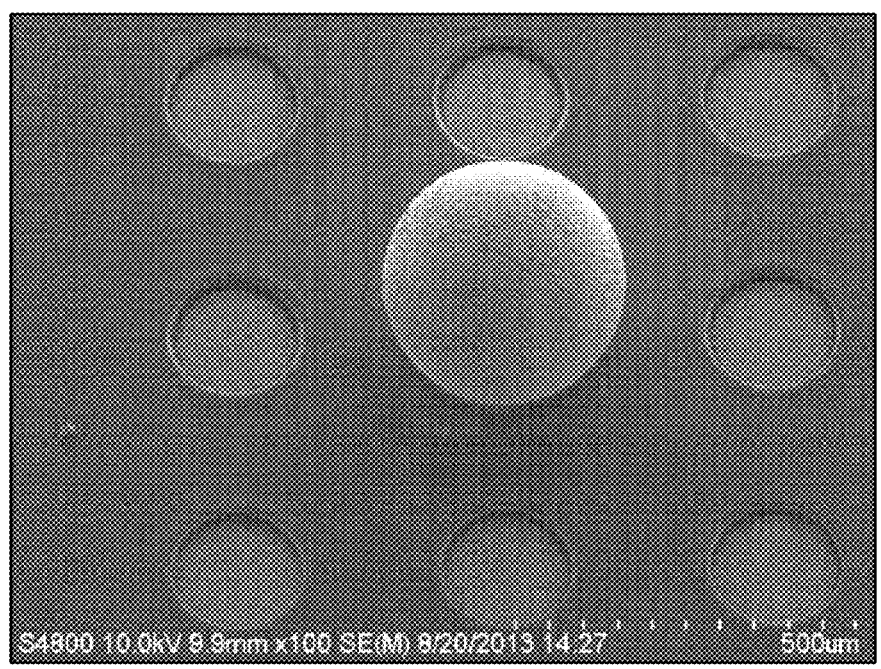

FIGS. 30A to 30D are optical microscope images of solder balls and copper pads on a silicon wafer after reflow, FIGS. 31A and 31B are scanning electron microscopy (SEM) images of solder balls and copper pads on a silicon wafer after reflow, and FIGS. 32A and 32B are SEM images of solder balls and copper pads on a PCB after reflow. All solder balls were first adhered to the coppers pads by using diisobutyl phthalate (DIBP).

As illustrated in FIGS. 30 to 32, in case of the diisobutyl phthalate (DIBP), the solder balls had a smooth and rounded shape and were well aligned with the pads. Also, according to the observed result, the diisobutyl phthalate (DIBP) left no residue after the reflow process was performed.

Through the above-described tests, where phthalate was used to attach the devices in the reflow process, it was confirmed that the devices bond well to each other without the need for separate cleaning and drying processes to remove adhesive residue before the inspection. Therefore, according to the foregoing embodiments, when compared to the reflow process using the typical flux, the number of processes may be reduced to improve productivity and eliminate harmful effects to the human body, equipment, and the environment.

The present invention has been described above with reference to the embodiments, but this is merely described, for example, the technical idea of the present invention, and thus is not limited thereto. It should be understood that various embodiments of the present invention are conceivable to a person skilled in the art. The scope of the present invention will depend only upon the appended claims.

What is claimed is:

1. A device packaging method comprising:
providing phthalate between first and second devices to attach the first and second devices to each other;
thermally processing the first and second devices that are attached to each other to remove the phthalate; and
thermally processing the first and second devices to fix the first and second devices to each other.

2. The device packaging method of claim 1, wherein the first device comprises at least one of a solder ball, a semiconductor chip, and a substrate, and
the second device comprises at least one of the semiconductor and the substrate.

3. The device packaging method of claim 1, wherein the phthalate comprises at least one of dimethyl phthalate (DMP) and diisobutyl phthalate (DIBP).

4. The device packaging method of claim 1, wherein attaching of the first and second devices comprises:
immersing a protruding portion of the first device in the phthalate to apply the phthalate to the protruding portion; and
moving at least one of the first and second devices to allow the protruding portion to contact the second device.

5. The device packaging method of claim 1, wherein the attaching of the first and second devices comprises:
applying the phthalate to at least one of the first and second devices; and
moving at least one of the first and second devices to allow the first and second devices to contact each other on the portion coated with the phthalate.

6. The device packaging method of claim 1, wherein the attaching of the first and second devices comprises:
providing a film formed of the phthalate to at least one of the first and second devices; and
moving at least one of the first and second devices to allow the first and second devices to contact each other on the portion coated with the phthalate.

7. The device packaging method of claim 1, wherein the attaching of the first and second devices comprises:

contacting the first and second devices with each other; and providing the phthalate to an edge of a contact portion between the first and second devices to allow the phthalate to be absorbed onto a boundary between the first and second devices.

8. The device packaging method of claim 1, wherein the removing of the phthalate comprises preheating the first and second devices that are attached to each other at a first temperature to remove the phthalate, and the fixing of the first and second devices comprises:

heating the first and second devices at a second temperature that is greater than the first temperature to melt a bonding material disposed on a contact portion between the first and second devices; and cooling the first and second devices at a third temperature that is less than the second temperature to solidify the bonding material.

9. The device packaging method of claim 8, wherein the first temperature is lower than a boiling point of the phthalate, the second temperature is greater than or equal to a melting point of the bonding material, and the third temperature is less than the melting point of the bonding material.

10. The device packaging method of claim 8, wherein the removing of the phthalate comprises preheating the first and second devices that are attached to each other at a temperature of about 180° C. to about 220° C.

11. The device packaging method of claim 10, wherein the preheating of the first and second devices comprises preheating the first and second devices that are attached to each other at the temperature of about 180° C. to about 220° C. for about 60 seconds.

12. The device packaging method of claim 8, wherein the removing of the phthalate comprises preheating the first and second devices that are attached to each other under an atmospheric pressure or a pressure that is less than the atmospheric pressure.

13. The device packaging method of claim 8, wherein the removing of the phthalate comprises preheating the first and second devices that are attached to each other at the first temperature while exposing the first and second devices to nitrogen or nitrogen containing formic acid vapor.

14. The device packaging method of claim 8, further comprising, after the removing of the phthalate, heating the first and second devices at a fourth temperature that is greater than the first temperature under an atmospheric pressure or a pressure that is less than the atmospheric pressure while exposing the first and second devices to formic acid vapor to remove impurities formed on a surface of the bonding material.

15. The device packaging method of claim 1, wherein the first and second devices that are fixed to each other are taken out of the device packaging facility and are inspected by an inspection facility.

* * * * *